United States Patent
Takizawa et al.

(10) Patent No.: US 10,740,101 B2
(45) Date of Patent: Aug. 11, 2020

(54) MEMORY SYSTEM

(71) Applicant: Toshiba Memory Corporation, Minato-ku (JP)

(72) Inventors: Kazutaka Takizawa, Yokohama (JP); Yoshihisa Kojima, Kawasaki (JP); Masaaki Niijima, Machida (JP)

(73) Assignee: Toshiba Memory Corporation, Minato-ku (JP)

( * ) Notice: Subject to any disclaimer, the term of this patent is extended or adjusted under 35 U.S.C. 154(b) by 33 days.

(21) Appl. No.: 16/278,764

(22) Filed: Feb. 19, 2019

(65) Prior Publication Data

US 2019/0286442 A1 Sep. 19, 2019

(30) Foreign Application Priority Data

Mar. 19, 2018 (JP) .................................. 2018-051604

(51) Int. Cl.

| | |
|---|---|
| *G11C 7/04* | (2006.01) |
| *G11C 16/26* | (2006.01) |
| *G06F 9/30* | (2018.01) |
| *G11C 16/10* | (2006.01) |
| *H01L 27/115* | (2017.01) |
| *G06F 11/08* | (2006.01) |

(Continued)

(52) U.S. Cl.
CPC ............ *G06F 9/3004* (2013.01); *G06F 11/08* (2013.01); *G11C 7/04* (2013.01); *G11C 11/5642* (2013.01); *G11C 16/10* (2013.01); *G11C 16/26* (2013.01); *H01L 27/115* (2013.01); *G11C 16/0483* (2013.01)

(58) Field of Classification Search
CPC ....... G11C 7/04; G11C 11/5642; G11C 16/10; G11C 16/26; G11C 16/0483
USPC .............................................. 365/212, 185.17
See application file for complete search history.

(56) References Cited

U.S. PATENT DOCUMENTS 8,213,255 B2 * 7/2012 Hemink ................... G11C 7/04
                                                                    365/211
8,472,274 B2 * 6/2013 Fai ....................... G11C 11/5642
                                                                    365/185.09

(Continued)

FOREIGN PATENT DOCUMENTS

JP           2011-028827         2/2011

*Primary Examiner* — Son L Mai
(74) *Attorney, Agent, or Firm* — Oblon, McClelland, Maier & Neustadt, L.L.P.

(57) ABSTRACT

According to one embodiment, a memory system includes a first nonvolatile memory, and a controller. The controller executes, to the first memory, a program operation first and a first read operation next. The program operation is an operation including (i) acquiring a first temperature, (ii) storing the first temperature, and (iii) controlling the access circuit to set a threshold voltage of a memory cell transistor at a value corresponding to first data. The first read operation is an operation for (i) acquiring a second temperature, (ii) computing a difference between the second and the first temperature, (iii) acquiring a first determination voltage, (iv) correcting the first determination voltage according to the difference, and (v) controlling the first memory to acquire second data corresponding to the threshold voltage on the basis of a comparison between the threshold voltage of the memory cell transistor and the corrected first determination voltage.

16 Claims, 18 Drawing Sheets

(51) Int. Cl.
*G11C 11/56* (2006.01)
*G11C 16/04* (2006.01)

(56) References Cited

U.S. PATENT DOCUMENTS

| | | | |
|---|---|---|---|
| 8,514,646 B1* | 8/2013 | Nan | G11C 11/5642 |
| | | | 365/185.02 |
| 8,705,273 B2 | 4/2014 | Kim et al. | |
| 9,390,806 B1* | 7/2016 | Hong | G11C 16/26 |
| 9,543,028 B2 | 1/2017 | Ray et al. | |
| 10,373,656 B2* | 8/2019 | Takada | G11C 16/10 |
| 10,446,242 B2* | 10/2019 | Achtenberg | G06F 11/1048 |
| 10,535,383 B2* | 1/2020 | Thalaimalaivanaraj | |
| | | | G06F 11/1068 |
| 10,564,900 B2* | 2/2020 | Achtenberg | G06F 3/064 |
| 10,642,510 B2* | 5/2020 | Sharon | G06F 3/064 |
| 2009/0267128 A1 | 10/2009 | Maejima | |
| 2009/0268522 A1 | 10/2009 | Maejima | |
| 2010/0207195 A1 | 8/2010 | Fukuzumi et al. | |
| 2010/0214838 A1 | 8/2010 | Hishida et al. | |
| 2010/0329026 A1 | 12/2010 | Nakamura et al. | |
| 2011/0284946 A1 | 11/2011 | Kiyotoshi | |
| 2012/0069663 A1 | 3/2012 | Itagaki et al. | |
| 2012/0307557 A1 | 12/2012 | Itagaki | |
| 2019/0043567 A1* | 2/2019 | Khakifirooz | G11C 11/5628 |

* cited by examiner

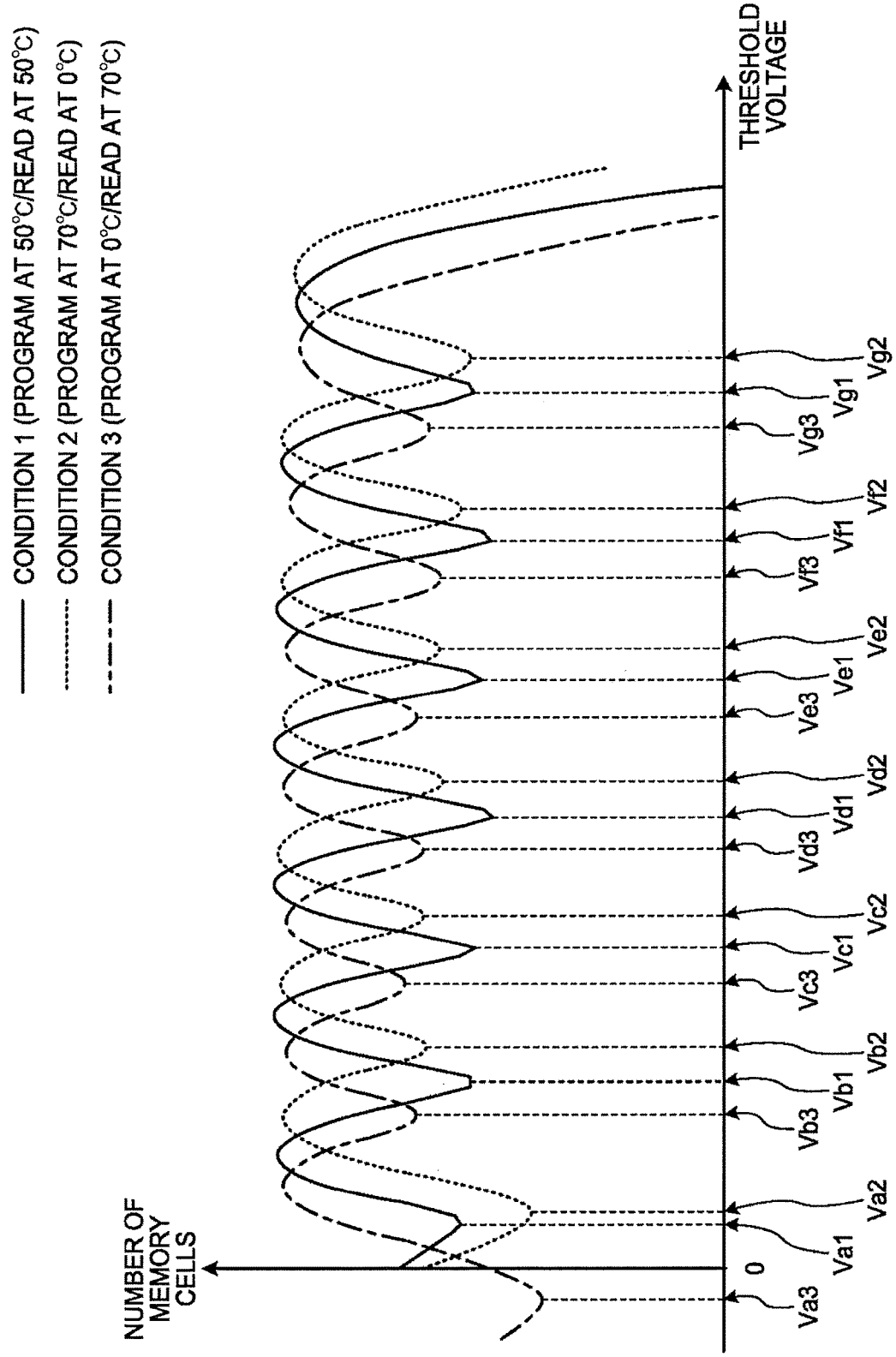

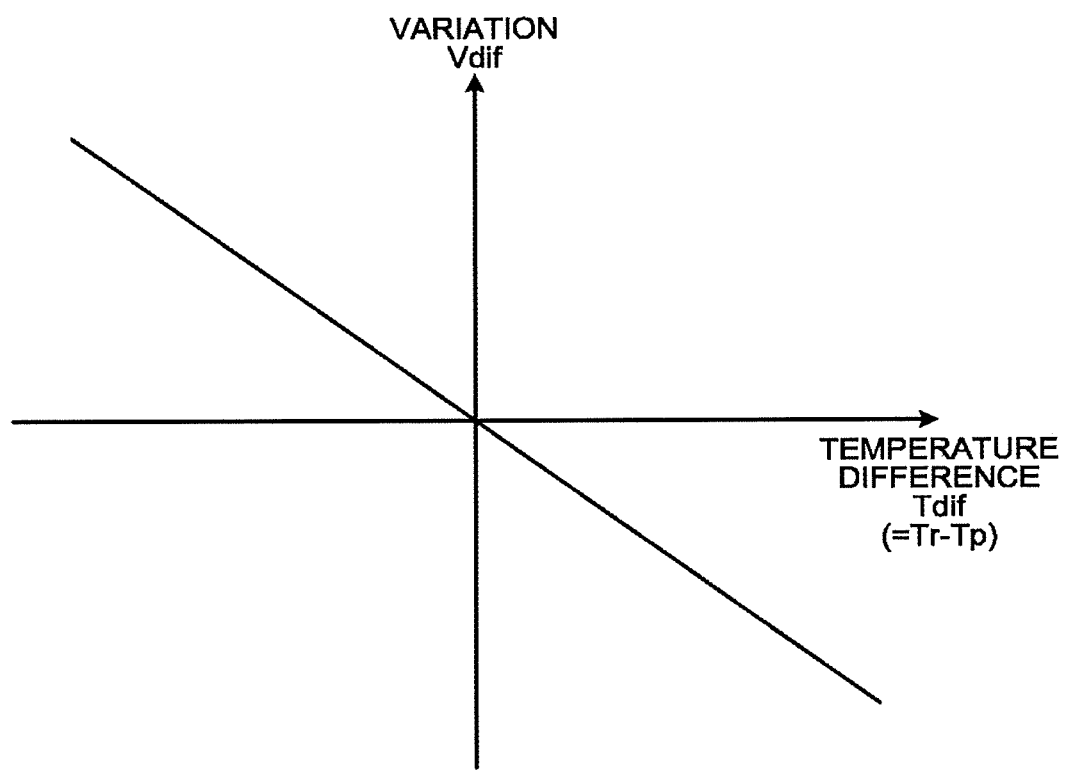

| | Vra | Vrb | Vrc | Vrd | Vre | Vrf | Vrg |
|---|---|---|---|---|---|---|---|
| BLK0 | | | | | | | |
| BLK1 | | | | | | | |
| BLK2 | | | | | | | |
| ⋮ | ⋮ | ⋮ | ⋮ | ⋮ | ⋮ | ⋮ | ⋮ |
| BLKn | | | | | | | |

223

MEMORY SYSTEM

CROSS-REFERENCE TO RELATED APPLICATIONS

This application is based upon and claims the benefit of priority from Japanese Patent Application No. 2018-051604, filed on Mar. 19, 2018; the entire contents of which are incorporated herein by reference.

FIELD

Embodiments described herein relate generally to a memory system.

BACKGROUND

Conventionally, a memory system including a memory cell transistor is known. Such a memory system determines data being held in the memory cell transistor in a read operation on the basis of a comparison between a threshold voltage of the memory cell and a determination voltage.

BRIEF DESCRIPTION OF THE DRAWINGS

FIG. 8 is a diagram explaining the threshold voltage distributions of the memory cells with different temperature conditions;

FIG. 9 is a diagram for explaining a relationship between a temperature difference Tdif and a variation Vdif in the threshold voltage of a memory cell defined by a correction algorithm in the first embodiment;

FIG. 10 is a diagram illustrating an example of temperature information in the first embodiment;

DETAILED DESCRIPTION

In general, according to one embodiment, a memory system includes a first nonvolatile memory, a temperature sensor and a controller. The first nonvolatile memory includes a memory cell transistor and an access circuit configured to control a threshold voltage of the memory cell transistor. The controller is configured to execute, to the first memory, a program operation first and a first read operation next. The program operation is an operation including (i) acquiring a first temperature with the temperature sensor, (ii) storing the first temperature, and (iii) controlling the access circuit to set the threshold voltage of the memory cell transistor at a value corresponding to first data. The first read operation is an operation for (i) acquiring a second temperature with the temperature sensor, (ii) computing a difference between the second temperature and the first temperature, (iii) acquiring a first determination voltage, (iv) correcting the first determination voltage according to the difference, and (v) controlling the access circuit to acquire second data corresponding to the threshold voltage on the basis of a comparison between the threshold voltage of the memory cell transistor and a second determination voltage. The second determination voltage is the corrected first determination voltage.

Exemplary embodiments of the memory system will be explained below in detail with reference to the accompanying drawings. The following embodiments are merely exemplary and not intended to limit the scope of the present invention.

First Embodiment

Figure 1:
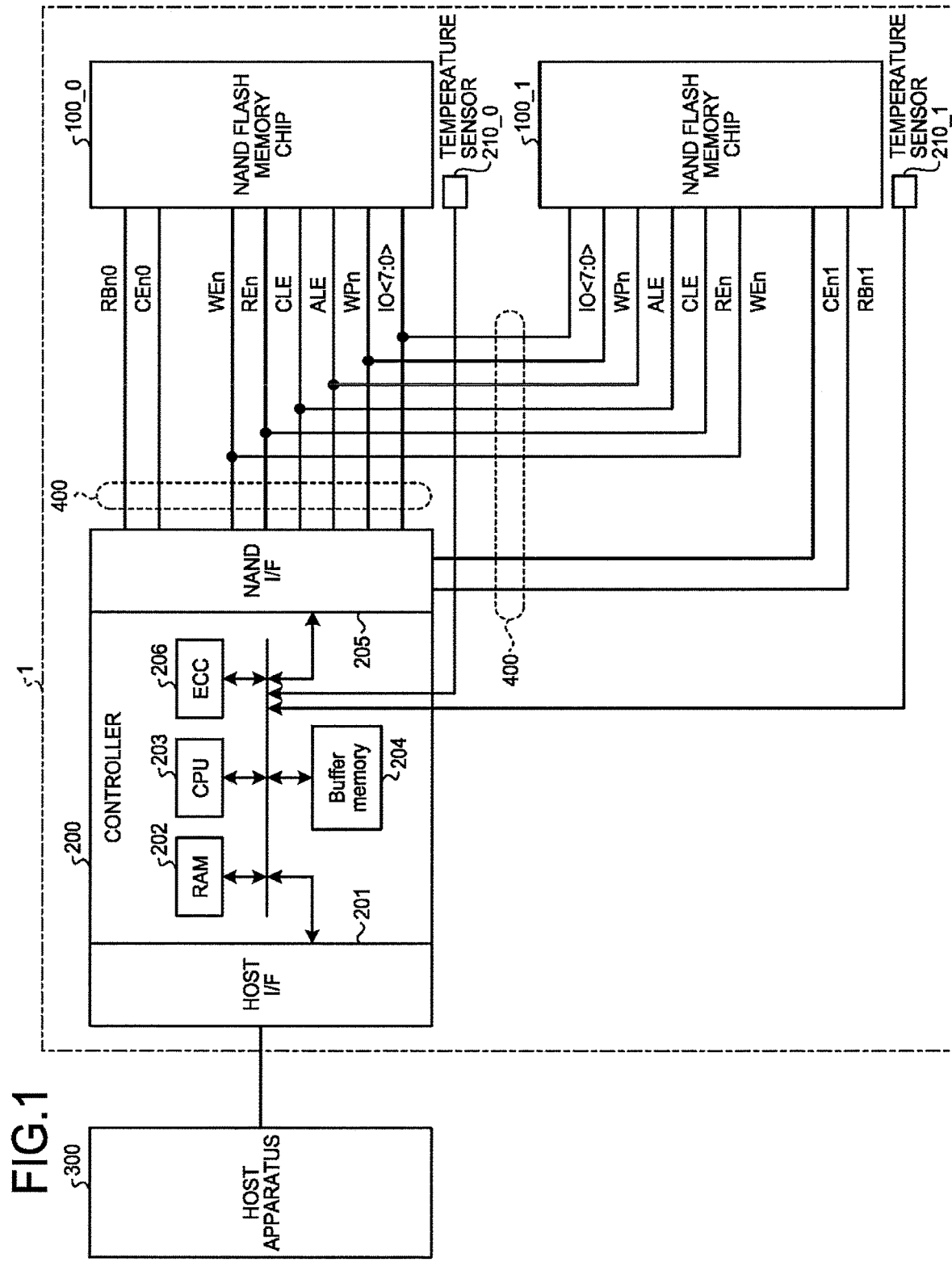
FIG. 1 is a diagram illustrating an example of the configuration of a memory system of a first embodiment.

FIG. 1 is a diagram illustrating an example of the configuration of a memory system of a first embodiment. As illustrated in FIG. 1, a memory system 1 is connectable to a host apparatus 300. The host apparatus 300 represents, for example, a server, a personal computer, or a mobile information processor. The memory system 1 functions as external storage of the host apparatus 300. The host apparatus 300 issues requests to the memory system 1. The requests include a read request and a write request.

The memory system 1 includes one or more NAND flash memory chips 100 and one controller 200. Herein, the memory system 1 includes one or more NAND flash memory chips 100, i.e., NAND flash memory chips 100_0 and 100_1. The number of the NAND flash memory chips 100 included in the memory system 1 is not limited to two.

Each NAND flash memory chip 100 includes a plurality of memory cell transistors, and stores data in nonvolatile manner. The NAND flash memory chip 100 is connected to the controller 200 via a NAND bus 400, and operates in response to a command from the controller 200. In other words, each NAND flash memory chip 100 transmits and receives, for example, an eight-bit input/output signal IO<7:0> to and from the controller 200. The input/output signal IO<7:0> is, for example, a command, an address, or data.

Moreover, the NAND flash memory 100 receives control signals from the controller 200 and transmits status signals to the controller 200.

The control signals include chip enable signals CEn0 and CEn1, a write enable signal WEn, a read enable signal REn, a command latch enable signal CLE, an address latch enable signal ALE, and a write protect signal WPn. The controller 200 transmits the signals WEn, REn, CLE, ALE, and WPn to the NAND flash memory chips 100_0 and 100_1. The controller 200 transmits the chip enable signal CEn0 to the NAND flash memory chip 100_0, and transmits the chip enable signal CEn1 to the NAND flash memory chip 100_1.

The chip enable signal CEn (CEn0 and CEn1) is a signal for placing an intended NAND flash memory 100 into an enabled state. The write enable signal WEn is a signal for instructing the NAND flash memory 100 to receive the input/output signal IO<7:0>. The read enable signal REn is a signal for instructing the NAND flash memory chip 100 to output the input/output signal IO<7:0>. The command latch enable signal CLE is a signal indicating that the input/output signal IO<7:0> is a command. The address latch enable signal ALE is a signal indicating that the input/output signal IO<7:0> is an address. The write protect signal WPn is a signal for commanding the NAND flash memory chip 100 to inhibit the execution of a program operation and an erase operation.

The status signals indicate various states of the NAND flash memory 100, and include a ready/busy signal RBn (RBn0 and RBn1). The ready/busy signal RBn is a signal indicating whether or not the NAND flash memory 100 is in a busy state (whether or not the NAND flash memory 100 is ready to receive a command from the controller 200). The ready/busy signal RBn0 is outputted from the NAND flash memory chip 100_0. The ready/busy signal RBn1 is outputted from the NAND flash memory chip 100_1. The controller 200 finds the state of each NAND flash memory chip 100, upon receiving the status signal and the ready/busy signal RBn.

The memory system 1 further includes one or more temperature sensors 210, i.e., temperature sensors 210_0 and 210_1. The temperature sensor 210 may be built in the NAND flash memory 100, or may be implemented as a discrete component independent from the NAND flash memory 100. Each temperature sensor 210 is used to measure an internal temperature (a junction temperature), a surface temperature, or an ambient temperature of the NAND flash memory chip 100. The temperature sensor 210_0 is provided near the NAND flash memory 100_0, and detects the ambient temperature of the NAND flash memory 100_0. The temperature sensor 210_1 is provided near the NAND flash memory 100_1, and detects the ambient temperature of the NAND flash memory 100_1. Hereinafter, the temperatures of the NAND flash memory chip 100 are defined as temperatures detected by their corresponding temperature sensors 210.

The controller 200 commands the NAND flash memory chip 100 to perform a read operation, a program operation, or an erase operation in response to a request of the host apparatus 300 or an internal process of the memory system.

The controller 200 includes a host interface circuit 201, a memory (RAM) 202, a processor (CPU) 203, a buffer memory 204, a NAND interface circuit 205, and an ECC (error correction code) circuit 206. The controller 200 can be configured as, for example, an SoC (System-on-a-Chip). Alternatively, the controller 200 may be configured of a plurality of chips. The controller 200 may include an FPGA (field-programmable gate array) or ASIC (application specific integrated circuit) instead of the CPU 203. In other words, the controller 200 may be configured by software, hardware, or a combination thereof.

The host interface circuit 201 is connected to the host apparatus 300 via a bus compliant with, for example, the ATA (Advanced Technology Attachment) standard, the SAS (Serial Attached SCSI) standard, or the PCI (Peripheral Components Interconnect) Express (registered trademark) standard, and is responsible for communication between the controller 200 and the host apparatus 300.

The NAND interface circuit 205 is connected to one or more NAND flash memory chips 100 via the NAND bus, and is responsible for communication between the controller 200 and the NAND flash memory chips 100.

The CPU 203 controls the operation of the controller 200.

The RAM 202 is used as a work area of the CPU 203. The buffer memory 204 temporarily holds data transmitted from and to the NAND flash memory chips 100. The RAM 202 and the buffer memory 204 may be configured of, for example, a DRAM (dynamic random access memory), an SRAM (static random access memory), or a combination thereof. The types of memory constituting the RAM 202 and the buffer memory 204 are not limited to the above types.

The ECC circuit 206 detects and corrects error in data, using an error correction code.

Figure 2:
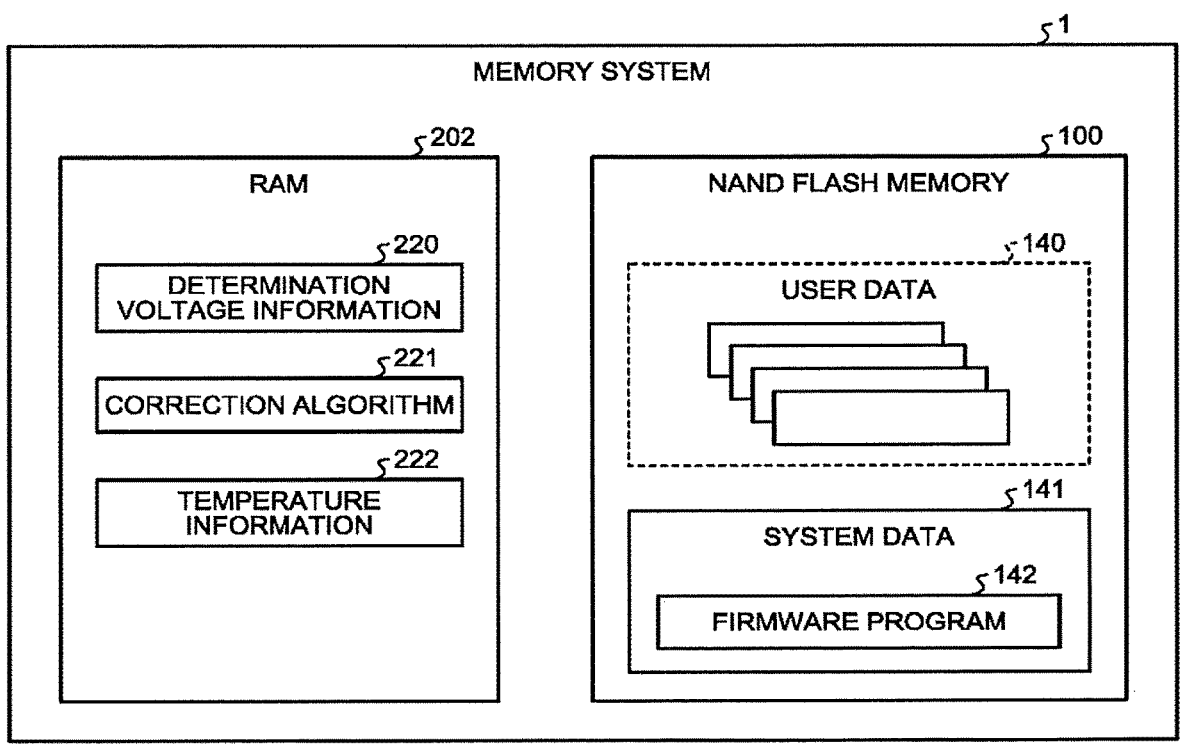
FIG. 2 is a diagram explaining various types of data held in the memory system of the first embodiment.

FIG. 2 is a diagram explaining various types of data held in the memory system 1 of the first embodiment.

The NAND flash memory chip 100 stores user data 140 and system data 141. The user data 140 represents data transmitted from the host apparatus 300 and encoded by the ECC circuit 206 using an error correction code. In the specification, data includes the user data 140.

The system data 141 is data required to control the controller 200. The system data 141 includes a firmware program 142. The firmware program 142 is a computer program for the CPU 203 to implement the operation of the controller 200. For example, the CPU 203 loads the firmware program 142 into the RAM 202 upon startup of the memory system 1. The CPU 203 then operates in accordance with the firmware program 142 loaded in the RAM 202 to implement the operation of the controller 200.

The RAM 202 stores determination voltage information 220, a correction algorithm 221, and temperature information 222. The determination voltage information 220, the correction algorithm 221, and the temperature information 222 are described in detail below.

The locations at which the system data 141, the determination voltage information 220, the correction algorithm 221, and the temperature information 222 are stored are not limited to the above examples. For example, part or all of the determination voltage information 220, the correction algorithm 221, and the temperature information 222 may be stored in the NAND flash memory 100. The memory system 1 may include any type of memory in addition to the RAM 202 and the NAND flash memory 100. Part or all of the system data 141, the determination voltage information 220, the correction algorithm 221, and the temperature information 222 may be stored in that memory.

Figure 3:
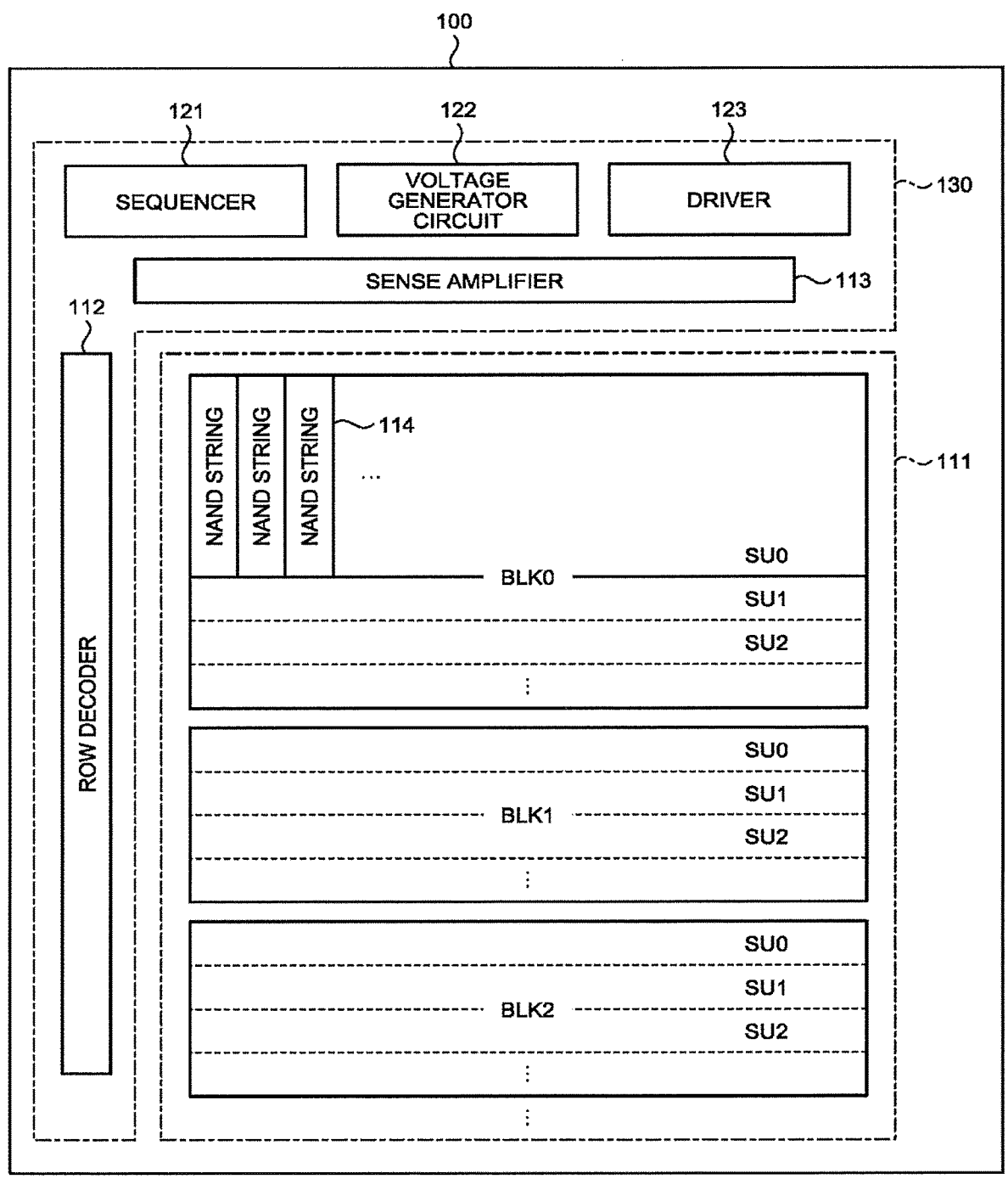
FIG. 3 is a diagram illustrating an example of the configuration of a NAND flash memory.

FIG. 3 is a diagram illustrating an example of the configuration of the NAND flash memory chip 100. As illustrated in FIG. 3, the NAND flash memory chip 100 includes a memory cell array 111 and an access circuit 130. The access circuit 130 includes a row decoder 112 and a sense amplifier 113.

The memory cell array 111 includes a plurality of blocks BLK (BLK0, BLK1, . . . ) that is each a set of nonvolatile memory cell transistors. Each of the blocks BLK includes a plurality of string units SU (SU0, SU1, . . . ) that is each a set of memory cell transistors associated with word lines and bit lines. Each of the string units SU includes a plurality of NAND strings 114 where memory cell transistors are connected in series. The number of the NAND strings 114 in the string unit SU may be designed with any number. The memory cell array 111 is described in detail below.

In the program operation and the read operation, for example, the row decoder 112 decodes an address of a block BLK and an address of an intended page, and selects a word line corresponding to the intended page. The row decoder 112 then applies appropriate voltages to the selected word line and unselected word lines.

The sense amplifier 113 includes a plurality of sense amplifier units (not illustrated). The sense amplifier units are provided corresponding to the bit lines. Each sense amplifier unit senses data being read from a memory cell transistor into a bit line during data read. Each sense amplifier unit transfers write data to a memory cell transistor during data write. Each sense amplifier unit further includes a plurality of latch circuits (not illustrated) to hold data.

The access circuit 130 further includes a sequencer 121, a voltage generator circuit 122, and a driver 123.

The sequencer 121 controls the entire operation of the NAND flash memory chip 100.

The voltage generator circuit 122 generates voltages required to program, read, and erase data by raising or lowering a power supply voltage VDD to supply the voltages to the driver 123.

The driver 123 supplies the voltages generated by the voltage generator circuit 122 to the row decoder 112, the sense amplifier 113, a source line, and a well, for example.

Next, the blocks BLK of the memory cell array 111 are described.

Figure 4:
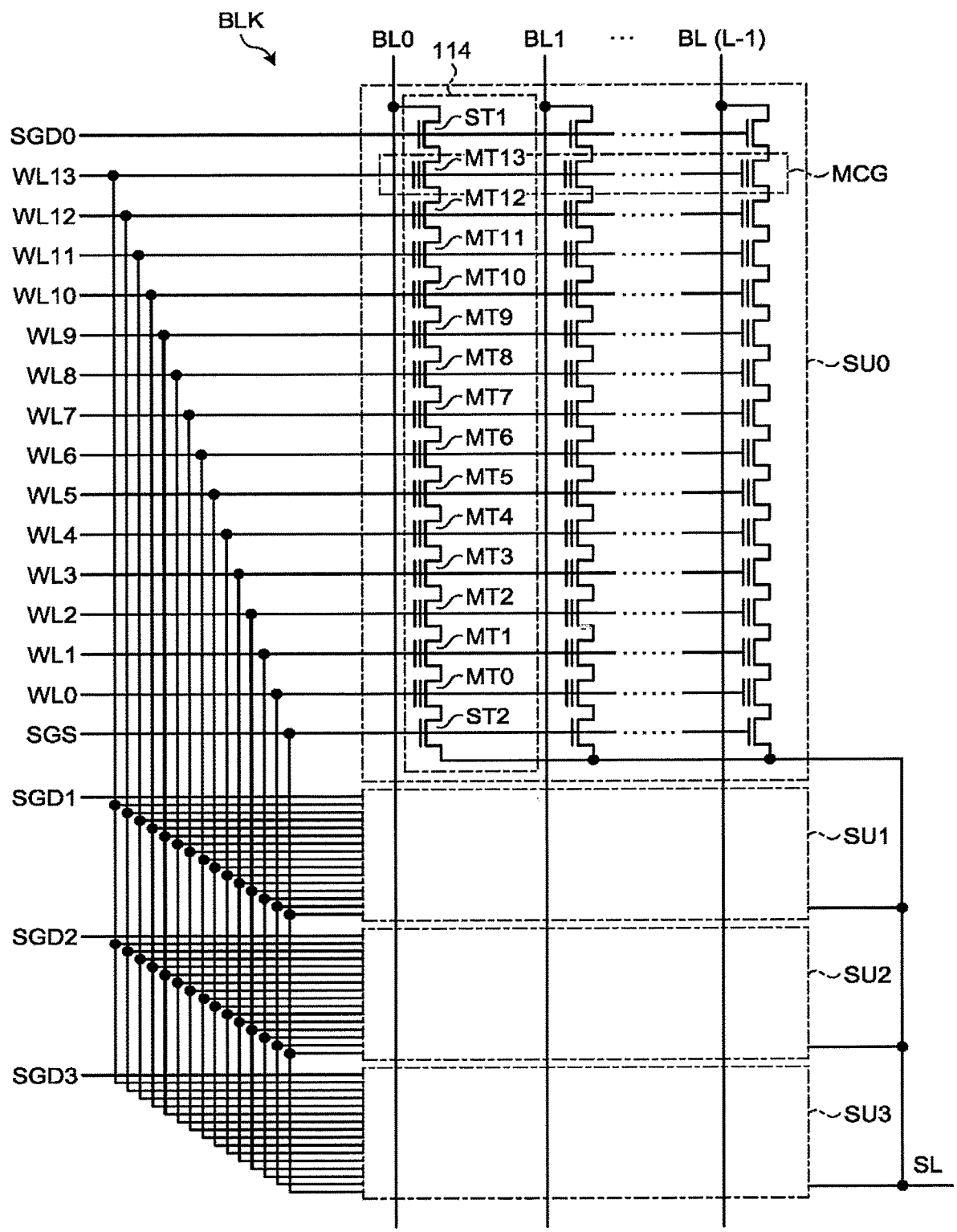
FIG. 4 is a diagram illustrating the circuit configuration of a block BLK in the first embodiment.

FIG. 4 is a diagram illustrating the circuit configuration of the block BLK of the first embodiment. The blocks BLK have the same configuration. Each block BLK includes, for example, four string units SU0 to SU3. Each string unit SU includes a plurality of NAND strings 114.

Each of the NAND strings 114 includes, for example, 14 memory cell transistors MT (MT0 to MT13) and select transistors ST1 and ST2. The memory cell transistor MT includes a control gate and a charge storage layer, and holds data in nonvolatile manner. The 14 memory cell transistors MT (MT0 to MT13) are connected in series between the source of the select transistor ST1 and the drain of the select transistor ST2. The memory cell transistor MT may be a MONOS type that includes an insulating film for the charge storage layer, or an FG type that includes a conductive film for the charge storage layer. The number of the memory cell transistors MT in the NAND string 114 is not limited to 14.

The gates of the select transistors ST1 in the string units SU0 to SU3 are connected to select gate lines SGD0 to SGD3, respectively. In contrast, the gates of the select transistors ST2 in the string units SU0 to SU3 are connected in common to, for example, a select gate line SGS. The gates of the select transistors ST2 in the string units SU0 to SU3 may be connected to different select gate lines SGS0 to SGS3 depending on the string units SU. The control gates of the memory cell transistors MT0 to MT13 in the same block BLK are connected in common to the word lines WL0 to WL13, respectively.

The drains of the select transistors ST1 in the NAND strings 114 in the string unit SU are connected to different bit lines BL (BL0 to BL(L−1) where L is a natural number equal to or greater than two), respectively. The bit line BL connects one NAND string 114 in each string unit SU in common across the blocks BLK. The sources of the select transistors ST2 are connected in common to a source line SL.

In other words, the string unit SU is a set of NAND strings 114 connected to different bit lines BL and connected to a same select gate line SGD. The block BLK is a set of string units SU connected to a same word line WL. The memory cell array 111 is a set of blocks BLK connected to a same bit line BL.

Data is collectively programmed to and read from memory transistors MT connected to one word line WL in one string unit SU. Hereinafter, a group of memory cell transistors MT collectively selected in data programming and data read will be referred to a "memory cell group MCG". A set of one-bit data to be programmed to or read from one memory cell group MCG will be referred to as a "page".

Data erase operation is executed in unit of block BLK. Data erase operation may be executed in unit smaller than block BLK. An erase method is described in, for example, "NONVOLATILE SEMICONDUCTOR MEMORY DEVICE", U.S. patent application Ser. No. 13/235,389, filed Sep. 18, 2011. Moreover, an erase method is described in "NON-VOLATILE SEMICONDUCTOR STORAGE DEVICE", U.S. patent application Ser. No. 12/694,690, filed Jan. 27, 2010. Furthermore, an erase method is described in "NONVOLATILE SEMICONDUCTOR MEMORY DEVICE AND DATA ERASE METHOD THEREOF", U.S. patent application Ser. No. 13/483,610, filed May 30, 2012. The entire contents of these patent applications are incorporated by reference in the specification of the present application.

Figure 5:
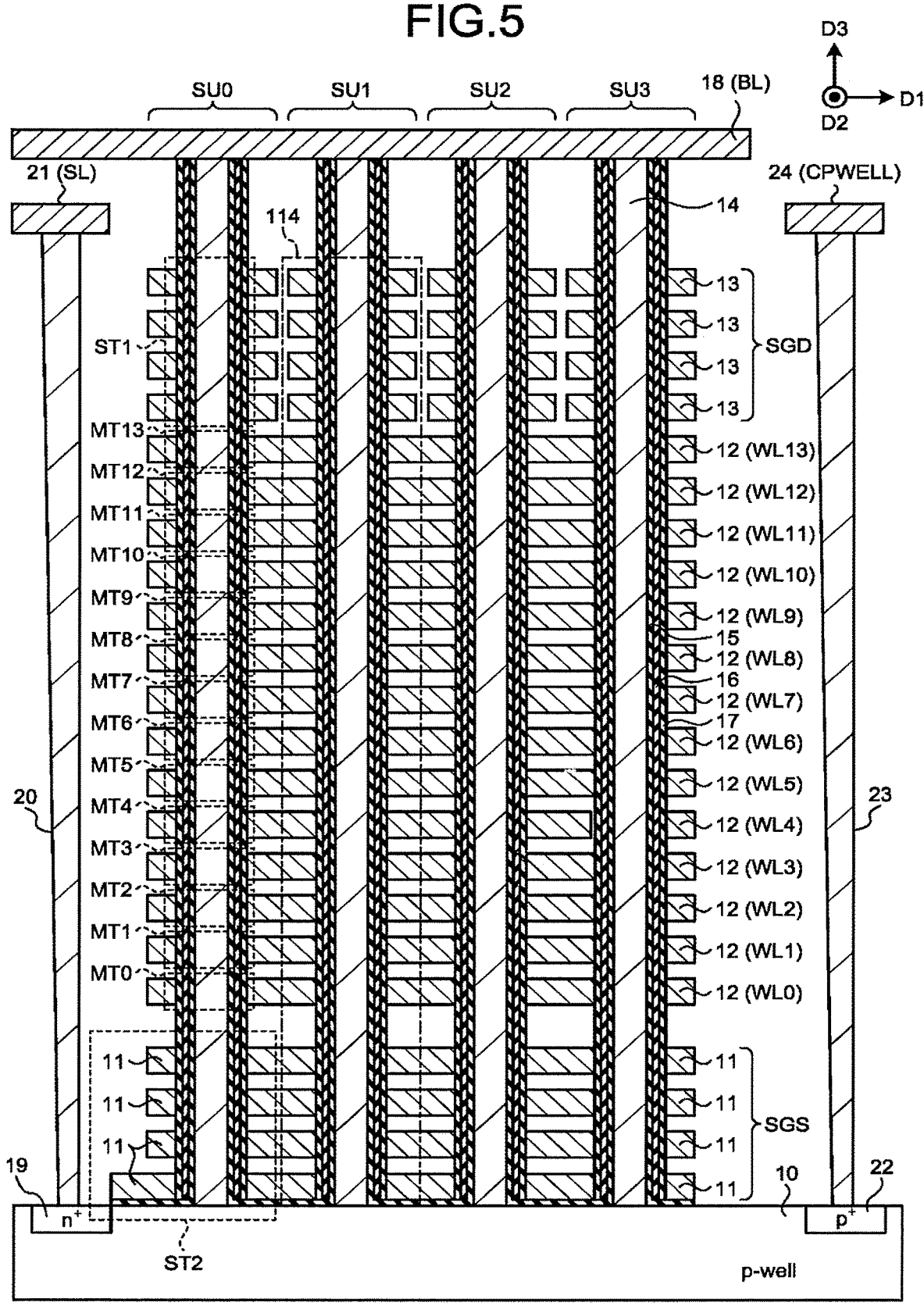
FIG. 5 is a cross-sectional view of a part of the block BLK in the first embodiment.

FIG. 5 is a cross-sectional view of a part of the block BLK of the first embodiment. As illustrated in FIG. 5, a plurality of NAND strings 114 is formed on a p-well region 10. In other words, for example, four wiring layers 11 functioning as the select gate line SGS, 14 wiring layers 12 functioning as the word lines WL0 to WL13, and four wiring layers 13 functioning as the select gate line SGD are sequentially laminated on the p-well region 10. An insulating film (not illustrated) is formed between the laminated wiring layers.

A pillar-shaped conductor 14 penetrates these wiring layers 13, 12, and 11 to the well region 10. A gate insulating film 15, a charge storage layer (insulating film or conductive film) 16, and a block insulating film 17 are sequentially formed on a side surface of the conductor 14, all of which form the memory cell transistor MT and the select transistors ST1 and ST2. The conductor 14 functions as a current path of the NAND strings 114, and is a region where the channel of each transistor is formed. The conductor 14 is connected at the top end to a metal wiring layer 18 functioning as the bit line BL.

An n+ impurity diffusion layer 19 is formed on a surface area of the well region 10. The diffusion layer 19 is provided with a contact plug 20 thereon. The contact plug 20 is connected to a metal wiring layer 21 functioning as the source line SL. A p+ impurity diffusion layer 22 is formed on a surface area of the well region 10. The diffusion layer 22 is provided with a contact plug 23 thereon. The contact plug 23 is connected to a metal wiring layer 24 functioning as well wiring CPWELL. The well wiring CPWELL is for applying a potential to the conductor 14 via the well region 10.

The above configurations are arrayed on a semiconductor substrate in a second direction D2 parallel to the substrate. The string unit SU includes a set of the NAND strings 114 arranged in the second direction D2.

The memory cell array 111 may have a configuration other than the above configuration. The configuration of the memory cell array 111 is described in, for example, "THREE DIMENSIONAL STACKED NONVOLATILE SEMICONDUCTOR MEMORY (THREE DIMENSIONAL STACKED NONVOLATILE SEMICONDUCTOR MEMORY)", U.S. patent application Ser. No. 12/407,403, filed Mar. 19, 2009. Moreover, the configurations of the memory cell array 111 are described in "THREE DIMENSIONAL STACKED NONVOLATILE SEMICONDUCTOR MEMORY (THREE DIMENSIONAL STACKED NONVOLATILE SEMICONDUCTOR MEMORY)", U.S. patent application Ser. No. 12/406,524, filed Mar. 18, 2009, "NON-VOLATILE SEMICONDUCTOR STORAGE DEVICE AND METHOD OF MANUFACTURING THE SAME (NON-VOLATILE SEMICONDUCTOR STORAGE DEVICE AND METHOD OF MANUFACTURING THE SAME)", U.S. patent application Ser. No. 12/679,991, filed Dec. 9, 2008, and "SEMICONDUCTOR MEMORY AND METHOD FOR MANUFACTURING SAME (SEMICONDUCTOR MEMORY AND METHOD FOR MANUFACTURING SAME)", U.S. patent application Ser. No. 12/532,030, filed Mar. 23, 2009. The entire contents of these patent applications are incorporated by reference in the specification of the present application.

The memory cell transistor MT will be simply referred to as the memory cell below.

Figure 6:
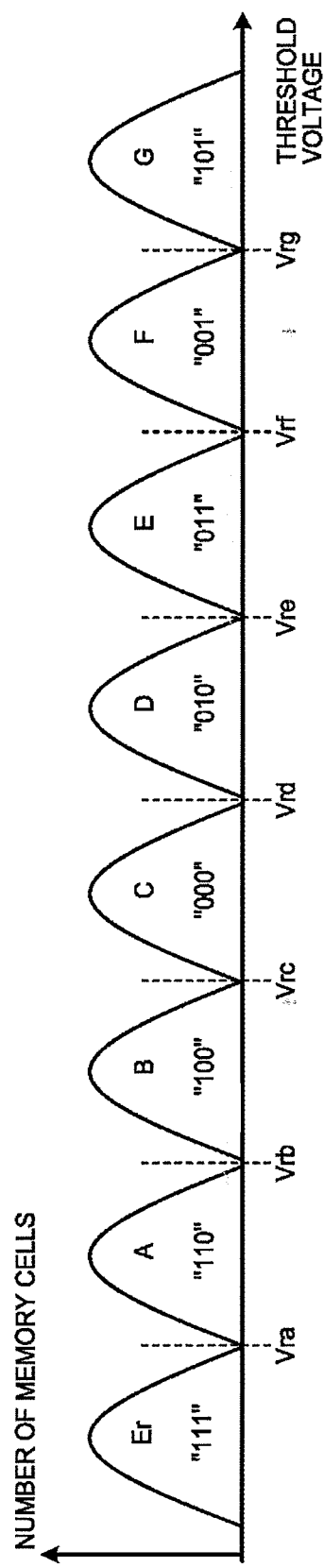
FIG. 6 is a diagram illustrating an example of a threshold voltage distribution of memory cells in the first embodiment.

FIG. 6 is a diagram illustrating an example of a threshold voltage distribution of the memory cells of the first embodiment. The vertical axis indicates the number of memory cells, and the horizontal axis indicates the threshold voltage. In the following the embodiment will describe an example of the memory cell which can hold eight-value data. However, data being held in one memory cell is not limited to eight-value data. In the first embodiment, the memory cell is capable of holding two or more value data (one or more-bit data).

As illustrated in FIG. 6, a range of the threshold voltage distribution is divided into eight sections. The eight sections are referred to as state "Er", state "A", state "B", state "C", state "D", state "E", state "F", and state "G" in order from the low threshold voltage. The access circuit 130 controls the threshold voltage of each memory cell to any of state "Er", state "A", state "B", state "C", state "D", state "E", state "F", and state "G". As a result, in plotting the number of memory cells with the threshold voltage as the horizontal axis, the memory cells ideally form eight distributions in different states, respectively, as illustrated in FIG. 6.

The eight states correspond to three-bit data. According to the example of FIG. 6, state "Er" corresponds to data "111", state "A" corresponds to data "110", state "B" corresponds to data "100", state "C" corresponds to data "000", state "D" corresponds to data "010", state "E" corresponds to data "011", state "F" corresponds to data "001", and state "G" corresponds to data "101". In FIG. 6, a most significant bit (MSB) is located at the left end among the bits, and a least significant bit (LSB) is located at the right end among the bits.

Thus, each memory cell holds data corresponding to a state of the threshold voltage of the memory cell. The relationship illustrated in FIG. 6 is an example of data coding. Data coding is not limited to the example of FIG. 6.

In three-bit data held in one memory cell, the LSB is referred to as a lower bit, the MSB is referred to as an upper bit, and the bit between the LSB and the MSB is referred to as a middle bit. A set of lower bits of all memory cell transistors MT of the same memory cell group MCG is referred to as a lower page. A set of middle bits of all memory cell transistors MT of the same memory cell group MCG is referred to as a middle page. A set of upper bits of all memory cell transistors MT of the same memory cell group MCG is referred to as an upper page.

Through the erase operation, the threshold voltage is lowered to state "Er". Through the program operation, the threshold voltage is maintained in state "Er", or raised to any of state "A", state "B", state "C", state "D", state "E", state "F", and state "G".

Specifically, in the program operation, the sequencer 121 selects one of the bit lines BL corresponding to a column address. The driver 123 controls the potential of the selected bit line to zero. The row decoder 112 selects the word line WL corresponding to a row address, and applies a programming pulse to the selected word line WL. Electrons are then injected into the charge storage layer 16 of the memory cell located at the intersection of the selected bit line BL and the selected word line WL. As a result, the threshold voltage of the memory cell increases. The sense amplifier 113 reads data at predetermined timing to check whether or not the threshold voltage of the memory cell has reached an intended state corresponding to write data (a verify read operation). The sense amplifier 113 continues to apply a programming pulse to the row decoder 112 until the threshold voltage of the memory cell reaches the intended state.

A memory cell having the threshold voltage set in a certain state by the program operation may be referred to below as a memory cell in a certain state.

A determination voltage is set between the threshold voltage distributions of two adjacent states. For example, as illustrated in FIG. 6, a determination voltage Vra is set between the threshold voltage distributions of states "Er" and "A", a determination voltage Vrb is set between the threshold voltage distributions of states "A" and "B", a determination voltage Vrc is set between the threshold voltage distributions of states "B" and "C", a determination voltage Vrd is set between the threshold voltage distributions of states "C" and "D", a determination voltage Vre is set between the threshold voltage distributions of states "D" and "E", a determination voltage Vrf is set between the threshold voltage distributions of states "E" and "F", and a determination voltage Vrg is set between the threshold voltage distributions of states "F" and "G". In the read operation, data associated with the state of a memory cell concerned is determined by using different determination voltages.

Assumed that data coding illustrated in FIG. 6 is applied, for example, when the memory cell is in any of states "Er", "E", "F", and "G", the value of the lower bit held in the memory cell is "1". When the memory cell is in any of states "A", "B", "C", and "D", the value of the lower bit held in the memory cell is "0". Hence, data in the lower page is determined by two different determination voltages Vra and Vre.

When the memory cell is in any of states "Er", "A", "D", and "E", the value of the middle bit held in the memory cell is "1". When the memory cell is in any of states "B", "C", "F", and "G", the value of the middle bit held in the memory cell is "0". Hence, data in the middle page is determined by three different determination voltages Vrb, Vrd, and Vrf.

When the memory cell is in any of states "Er", "A", "B", and "G", the value of the upper bit held in the memory cell is "1". When the memory cell is in any of states "C", "D", "E", and "F", the value of the upper bit held in the memory cell is "0". Hence, data in the upper page is determined by two different determination voltages Vrc and Vrg.

That is, the determination voltages used for data determination differ depending on the types of page to read. The row decoder 112 uses different determination voltages according to the types of page to read in the read operation.

Specifically, in the read operation, the sense amplifier 113 precharges the bit lines BL with the power supply voltage VDD. The row decoder 112 selects one of the word lines WL corresponding to a row address. The row decoder 112 brings memory cells connected to unselected word lines WL into conduction, and applies different determination voltages corresponding to the types of page to read sequentially to the selected word line WL. The sense amplifier 113 determines data corresponding to the state of a memory cell concerned by identifying the determination voltage that has caused a discharge of the charge stored by the precharge to the source line SL.

The NAND flash memory chip 100 of the embodiment executes the read operation in a plurality of modes including a normal mode and a negative sensing mode.

In the normal mode, the driver 123 controls the potential of the source line SL to zero (i.e., VSS). The row decoder 112 then applies a transfer potential Vread to the unselected word lines WL to bring the unselected word lines WL into conduction. Thereby, in the normal mode, a determination voltage is applied as it is to the selected word line WL. In other words, if the driver 123 cannot generate a negative voltage, a determination voltage of a negative value is not usable in the normal mode.

Meanwhile, in the negative sensing mode, the driver 123 biases the potential of the source line SL to the positive side. In other words, the driver 123 applies a positive-value voltage (denoted as Vbias) to the source line SL. Consequently, a potential difference Vgs between the word line WL and the source line SL is biased by Vbias to the negative side. Thus, to bring the unselected word lines WL into conduction in the negative sensing mode, an apparent negative determination voltage is applicable to the selected word line WL. In the negative sensing mode, the row decoder 112 biases the transfer potential Vread applied to the unselected word lines WL by Vbias to the positive side.

The bias voltage Vbias may differ depending on the value of determination voltage, or may not differ depending on different determination voltages.

FIG. 6 illustrates the example where the memory cells exhibit eight distributions. However, the threshold voltage of a memory cell may change according to a use history. The use history includes accesses (a program operation, a read operation, and an erase operation) to the memory cell, an elapsed time from the completion of programming of the memory cell, accesses to memory cells near the memory cell, temperatures during the read operation, the erase operation and the program operation to the memory cell, and a temperature during a period after the program operation to the memory cell to a read operation to the memory cell. The threshold voltage of the memory cell may change, therefore, in reality the distributions of the states may overlap one another in the read operation.

Figure 7:
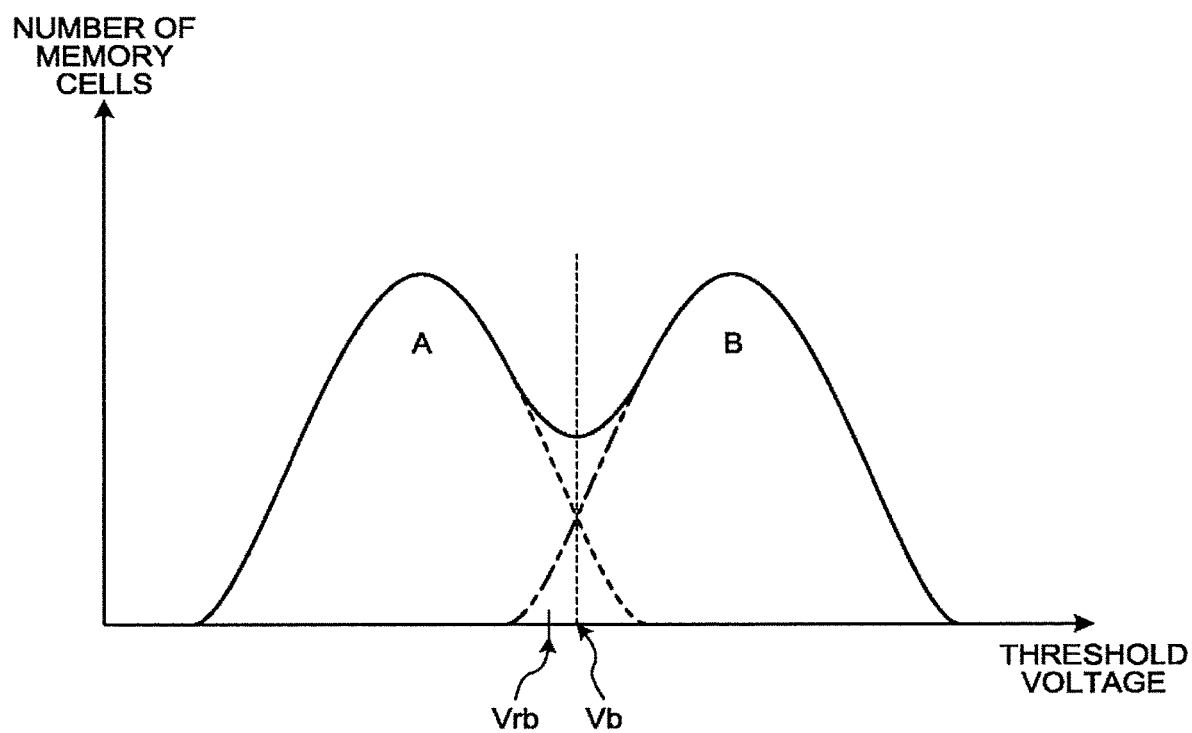
FIG. 7 is a diagram illustrating another example of a threshold voltage distribution of memory cells in the first embodiment.

FIG. 7 is a diagram illustrating another example of a threshold voltage distribution of the memory cells of the first embodiment. Herein, for simple description, the figure shows a threshold voltage distribution of memory cells in state "A" or "B" by way of example. The solid line indicates the threshold voltage distribution of the memory cells in state "A" or "B" (i.e, both of the memory cells in state "A" and the memory cells in state "B"). The broken line indicates a threshold voltage distribution of memory cells in state "A", and the dot-and-dash line indicates a threshold voltage distribution of memory cells in state "B". In the example of FIG. 7, the high-side tail of the threshold voltage distribution of the memory cells in state "A" and the low-side tail of the threshold voltage distribution of the memory cells in state "B" overlap each other. In other words, the maximum value of the threshold voltages of the memory cells in state "A" exceeds the determination voltage Vrb, and the minimum value of the threshold voltages of the memory cells in state "B" is below the determination voltage Vrb. When a memory cell in state "A" exhibiting a higher threshold voltage than the determination voltage Vrb is read, the memory cell is recognized as being in state "B". That is, data programmed as "110" is read as "100". When a memory cell in state "B" exhibiting a lower threshold voltage than the determination voltage Vrb is read, the memory cell is recognized as being in state "A". That is, data programmed as "100" is read as "110".

Thus, the value of read data may differ from a programmed value due to a variation in the threshold voltage. The ECC circuit 206 may be able to detect and correct changed data as an error bit. However, there is a limit of the number of error bits that can be corrected by the ECC circuit 206. The controller 200 is configured to be able to shift each determination voltage to prevent the number of error bits in read data (hereinafter, the number of errors) from exceeding the limit.

For example, by using, as the determination voltage, a voltage value where the number of memory cells in state "A" or "B" which have a threshold voltage of the voltage value is minimum among a range of threshold voltages of the two adjacent states, the number of errors in read data can be reduced. In the distributions illustrated in FIG. 7, Vb corresponds to the voltage value at which the total number of memory cells is minimal. In other words, the use of Vb as the determination voltage makes it possible to reduce the number of error bits occurring due to reading data programmed with "110" as "100" or reading data programmed with "100" as "110".

Hereinafter, the voltage value where the number of memory cells in state "A" or "B" which have a threshold voltage of the voltage value is minimum among a range of threshold voltages of the two adjacent states will be referred to as an optimal determination voltage.

FIG. 8 is a diagram explaining an example of the threshold voltage of the memory cells with different temperature conditions. In FIG. 8, the horizontal axis indicates the threshold voltage, and the vertical axis indicates the number of memory cells.

In FIG. 8, the solid line indicates threshold voltage distributions of the memory cells measured when data has been programmed and then read at the same temperature of 50 degrees Celsius (condition 1). As described above, since the optimal determination voltage is a voltage value at which the number of error bits between the adjacent states is minimal, in the condition 1, voltage values Va1, Vb1, Vc1, Vd1, Ve1, Vf1, and Vg1 correspond to the optimal determination voltages. All the voltage values Va1, Vb1, Vc1, Vd1, Ve1, Vf1, and Vg1 are equal to or greater than zero.

In FIG. 8, the dotted line indicates threshold voltage distributions of the memory cells measured when data has been programmed at 70 degrees Celsius and then read at zero degree Celsius (condition 2). In this case, the threshold voltage distributions of the memory cells are shifted in the positive direction as compared with the condition 1. Along with this, the respective optimal determination voltages are shifted in the positive direction with respect to the condition 1. In other words, in the condition 2, Va2 (>Va1), Vb2

(>Vb1), Vc2 (>Vc1), Vd2 (>Vd1), Ve2 (>Ve1), Vf2 (>Vf1), and Vg2 (>Vg1) correspond to the optimal determination voltages. All of the voltage values Va2, Vb2, Vc2, Vd2, Ve2, Vf2, and Vg2 are positive values.

In FIG. 8, the dot-and-dash line indicates threshold voltage distributions of the memory cells measured when data has been programmed at zero degrees Celsius and then read at 70 degrees Celsius (condition 3). In this case, the threshold voltage distributions of the memory cells are shifted to the negative side as compared with the condition 1. Along with this, the respective optimal determination voltages are shifted in the negative direction with respect to the condition 1. It is assumed that due to the shift of the optimal determination voltages to in negative direction, a voltage value (let it be Va3) where the number of memory cells in state "Er" or "A" which have a threshold voltage of the voltage value is minimum among a range of threshold voltages of the two adjacent states be a negative value. In the condition 3, the negative voltage value Va3 (<Va1), and Vb3 (<Vb1), Vc3 (<Vc1), Vd3 (<Vd1), Ve3 (<Ve1), Vf3 (<Vf1), and Vg3 (<Vg1) correspond to the optimal determination voltages. All of the voltage values Vb3, Vc3, Vd3, Ve3, Vf3, and Vg3 are positive values.

In this manner, the threshold voltage of a memory cell shifts depending on a difference in temperature between the program operation and the read operation. It is considered that this arises from a variation in the threshold voltage of a memory cell depending on the temperature. In a verify read operation in the program operation and the read operation, the threshold voltage increases or decreases depending on the temperature. In the case of occurrence of a difference in temperature between the program operation and the read operation, the threshold voltage during the read operation increases or decreases from the threshold voltage during the program operation by an amount corresponding to the temperature difference.

The increase or decrease in the threshold voltage in accordance with the temperature may be compensated for in the NAND flash memory chip 100. For example, it is possible to maintain a programmed state of the memory cell by programming irrespective of the temperature during the program operation, or read the programmed state of the memory cell irrespective of the temperature during the read operation. However, there is a limitation to a temperature difference that can be compensated for in the NAND flash memory chip 100. Furthermore, to compensate for the threshold voltage according to the temperature in the NAND flash memory chip 100, the NAND flash memory chip 100 needs to autonomously perform another read operation for acquiring the temperature during the program operation in the read operation, which results in substantially degrading the read performance.

Thus, the assistance of the controller 200 is necessary to compensate for a temperature difference to a certain degree or more.

In the embodiment, in the case of occurrence of a temperature difference between the program operation and the read operation, the controller 200 corrects the determination voltage according to the temperature difference between the program operation and the read operation so as to reduce the number of error bits in read data as much as possible.

Specifically, the CPU 203 measures the temperature of the NAND flash memory chip 100 with the temperature sensor 210 in the program operation. The CPU 203 records the acquired measured value (temperature data) as the temperature in the program operation (denoted as Tp) in the temperature information 222.

For execution of a read operation, the CPU 203 measures the temperature of the NAND flash memory chip 100 with the temperature sensor 210 before commanding the NAND flash memory chip 100 to perform the read operation. In other words, the CPU 203 acquires the temperature thereof in the read operation (denoted as Tr). The CPU 203 further acquires the temperature thereof in the program operation Tp from the temperature information 222. The CPU 203 then determines a correction value Vcor of the determination voltage on the basis of a difference between the temperature in the read operation Tr and the temperature in the program operation Tp (hereinafter, Tr−Tp as an example).

The CPU 203 acquires the correction value Vcor corresponding to the difference (Tr−Tp) in accordance with the correction algorithm 221. The correction algorithm 221 is information that defines a relationship between a temperature difference Tdif and a variation Vdif in the threshold voltage of the memory cell.

The timing at which temperature is measured is not limited to the above timing. The CPU 203 may measure the temperature regularly or non-regularly, and store each measured value in, for example, the RAM 202. The CPU 203 may acquire, as Tp, a measured value stored latest before the program operation, and acquire, as Tr, a measured value stored latest before the read operation.

FIG. 9 is a diagram for explaining the relationship defined by the correction algorithm 221 of the first embodiment. In FIG. 9, the horizontal axis indicates the temperature difference Tdif, and the vertical axis indicates the variation Vdif in the threshold voltage. According to an example of FIG. 9, the temperature difference Tdif and the variation Vdif in the threshold voltage have a negative correlation.

The CPU 203 set, as the correction value Vcor, the value of the variation Vdif in the threshold voltage when the temperature difference Tdif is (Tr−Tp). The CPU 203 sets a determination voltage after correction by adding the correction value Vcor to a determination voltage before correction. Whether to add or subtract the correction value Vcor to or from the determination voltage before correction depends on the definitions of the temperature difference Tdif and the variation Vdif in the threshold voltage.

The correction algorithm 221 for deciding the correction value Vcor may be prepared individually for the different determination voltages, or may be used in common for all the determination voltages.

The CPU 203 corrects each of the determination voltages according to the type of page to read. When the corrected determination voltages include negative values, the CPU 203 sets the NAND flash memory chip 100 in the negative sensing mode. When the corrected determination voltages include no negative values, the CPU 203 controls the NAND flash memory chip 100 to operate in the normal mode.

The temperature information 222 may store the temperature Tp in each unit area. The unit area refers to a memory area having a predetermined size, and is, for example, a package including one or more NAND flash memory chips 100, a plurality of packages, a NAND flash memory chip 100, a block BLK, a string unit SU, an MCG, a word line WL, or a group of word lines WL. With use of a multi-layered NAND flash memory 100, a chip of the NAND flash memory 100 may be set as a unit area. The multi-layer structure represents a structure where a plurality of chips is stacked. Herein, as illustrated in FIG. 10, the temperature Tp is recorded for each block BLK in the temperature information 222, by way of example.

The temperature information 222 may be saved in the NAND flash memory chip 100 before power-off and loaded into the RAM 202 upon startup.

The timing at which the temperature Tp is measured does not need to completely match with the timing at which the program operation is executed, as long as the amount of a variation in the temperature from the one at the program operation is sufficiently small. Herein, the temperature Tp during the program operation is recorded in unit of blocks larger than pages being the unit of the program operation. Hence, the temperature Tp of one block BLK is measured at timing at which data has been programmed to the entire block BLK, by way of example. Programming data to the entire block BLK refers to programming data to the block BLK with no free space. The method and timing for acquiring the temperature Tp on a block basis is not limited to the above example.

The determination voltage before correction may be acquired in any method. Herein, as an example, the CPU 203 decides the determination voltage before correction on the basis of the determination voltage information 220. The determination voltage information 220 is configured in such a manner that all the determination voltages are decided. The determination voltage information 220 may contain the determination voltages before correction or shift amounts of the determination voltages from a certain reference value. The CPU 203 acquires the determination voltage after correction by adding the correction value Vcor to, for example, the determination voltage before correction.

The determination voltage information 220 may be updated at any timing. For example, the determination voltage information 220 may be updated according to the use history. Moreover, the determination voltage information 220 may be configured in such a manner that the determination voltages before correction may be acquired individually for unit areas. The unit areas may be freely set, as with the temperature information 222.

Next, the operation of the memory system 1 of the first embodiment is described.

Figure 11:
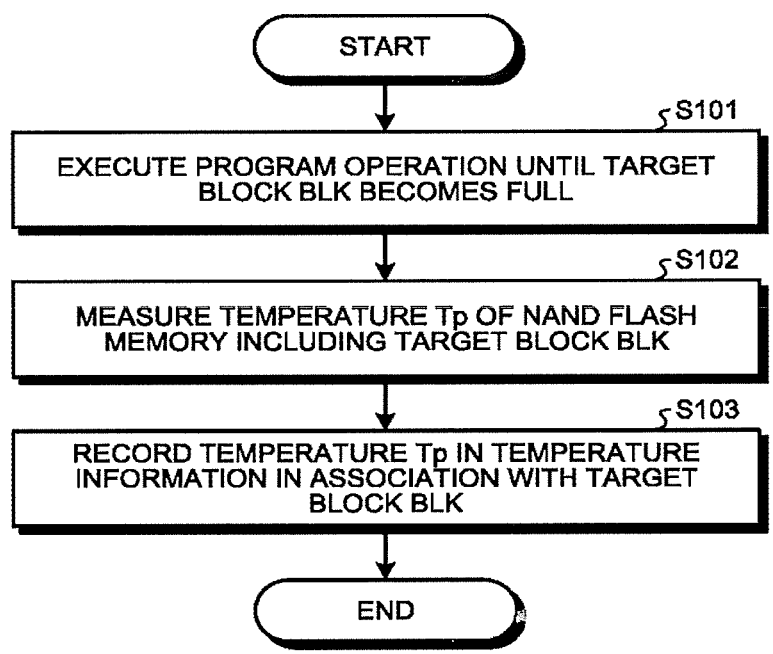
FIG. 11 is a flowchart explaining a program operation of the memory system of the first embodiment.

FIG. 11 is a flowchart explaining a program operation of the memory system 1 of the first embodiment.

The CPU 203 programs data in one block BLK until the block BLK becomes full (S101), and then measures the temperature Tp of the NAND flash memory chip 100 including the block BLK (S102). The CPU 203 then records the temperature Tp in the temperature information 222 in association with the block BLK (S103). The program operation is completed in S103.

Figure 12:
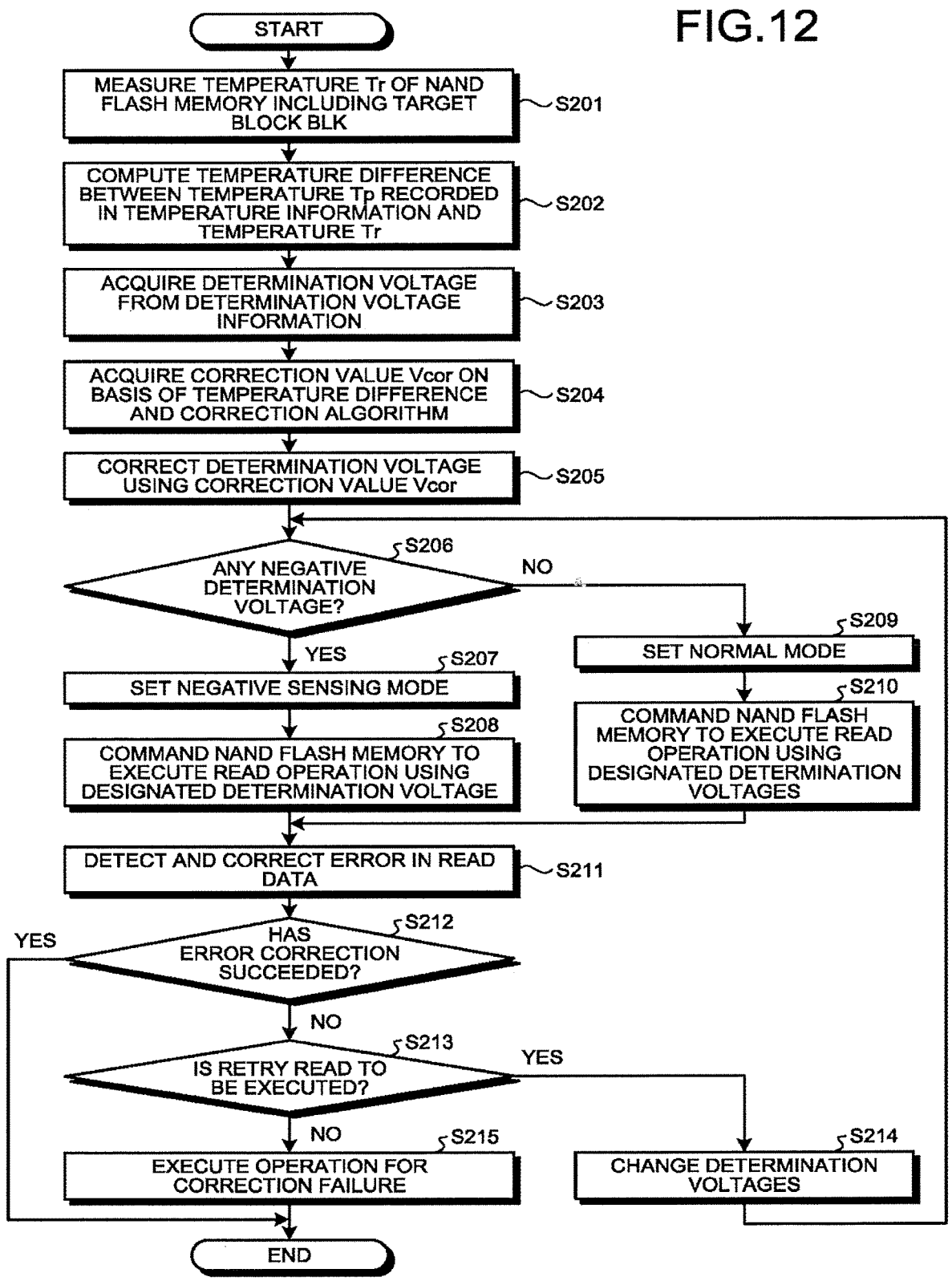
FIG. 12 is a flowchart explaining a read operation of the memory system of the first embodiment.

FIG. 12 is a flowchart explaining the read operation of the memory system 1 of the first embodiment.

When executing the read operation to one block BLK, the CPU 203 first measures the temperature Tr of the NAND flash memory 100 chip including the block BLK (S201). The CPU 203 then computes a temperature difference (Tr−Tp) between the temperature Tp recorded in the temperature information 222 associated with the block BLK, and the temperature Tr measured in the operation of S201 (S202).

Next, the CPU 203 acquires a determination voltage from the determination voltage information 220 (S203). The CPU 203 then acquires a correction value Vcor on the basis of the temperature difference (Tr−Tp) computed by the operation of S202 and the correction algorithm 221 (S204). The CPU 203 then corrects the determination voltage acquired by the operation of S203, using the correction value Vcor acquired by the operation of S204 (S205).

The CPU 203 executes the operations of S203 to S205 to each of the determination voltages corresponding to a page to read.

The CPU 203 determines whether or not the determination voltages include a negative voltage value (S206). With a negative determination voltage found (Yes in S206), the CPU 203 sets the negative sensing mode (S207), and commands the NAND flash memory chip 100 to execute a read operation with a designated determination voltage (S208).

Figure 13:
FIG. 13 is a diagram illustrating an example of a command sequence for setting a negative sensing mode in the first embodiment.

In S207, the controller 200 transmits, for example, such a command as illustrated in FIG. 13 to the NAND flash memory chip 100. In FIG. 13, VSRC is set to the value of the bias Vbias that is applied to the source line SL. The controller 200 commands the NAND flash memory chip 100 by a combination of EFh, ααh, and VSRC to operate in the negative sensing mode.

For example, assumed that a desired effective determination voltage to use be Vnet, a word line potential to set be VCG, and a settable minimum word line potential be VCG_min (=0).

In the case of Vnet<VCG_min, the operation S206 results in a positive determination. In this case, for example, the CPU 203 sets VCG_min as VCG, and sets (VCG_min−Vnet) as Vbias (that is, VSRC). Consequently, a net determination voltage is set to Vnet by VCG−Vbias=VCG_min−(VCG_min−Vnet)=Vnet.

Figure 14:
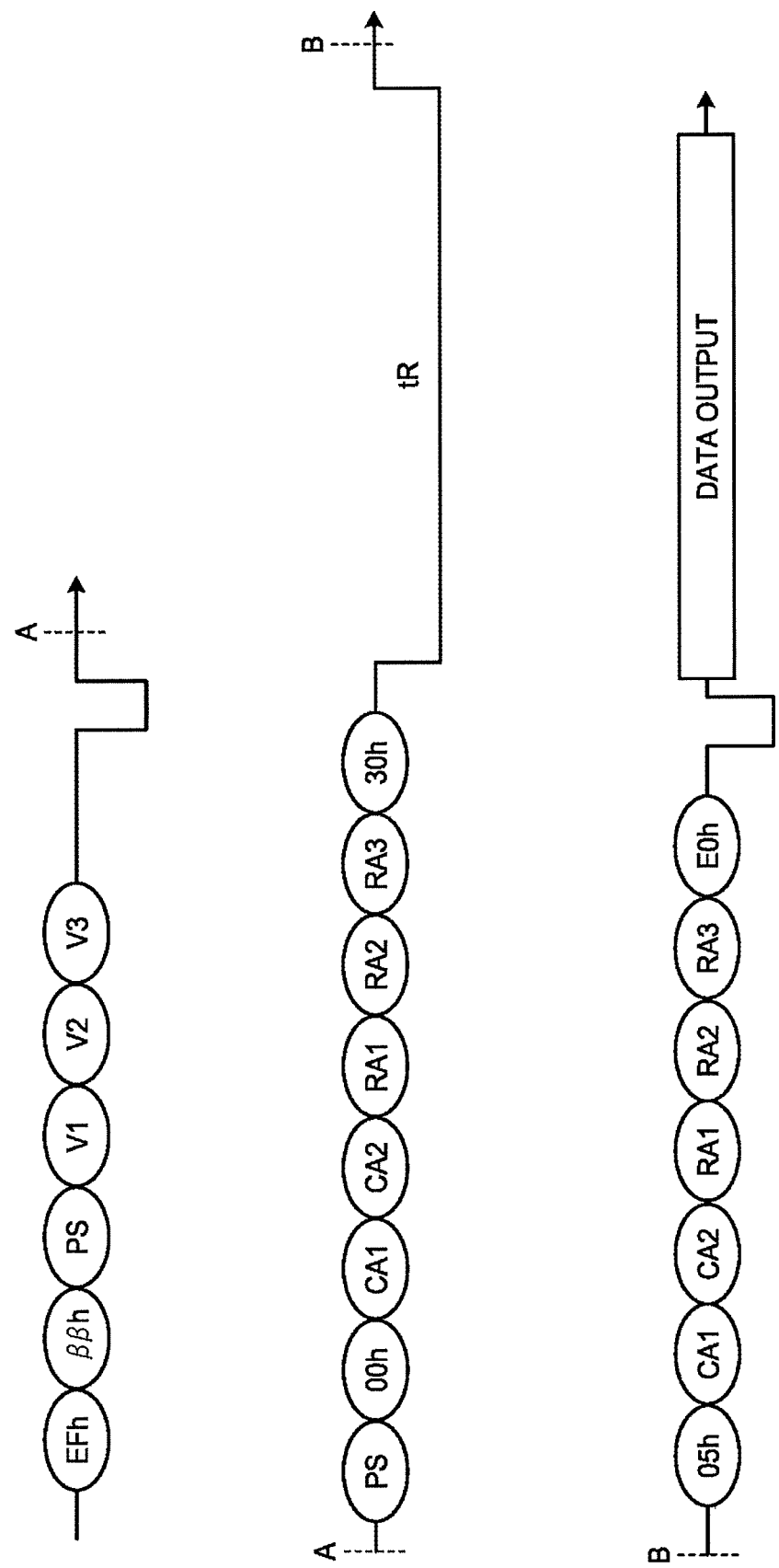
FIG. 14 is a diagram illustrating an example of command sequences for executing a read operation using a designated determination voltage in the first embodiment.

In S208, the controller 200 transmits, for example, such a command as illustrated in FIG. 14 to the NAND flash memory chip 100.

FIG. 14, shows a command sequence, i.e., a sequence from EFh to V3 for setting a determination voltage. A combination of EFh and ββh represents a command for setting the shift amount of the determination voltage (more specifically, the shift amount of VCG). PS represents a command for selecting a page. For example, any of a lower page, a middle page, and an upper page is designated by PS. The shift amounts of three determination voltages corresponding to selected pages are designated by V1, V2, and V3.

For example, upon selection of a lower page by PS, the shift amount of Vra is designated by V1, and the shift amount of Vre is designated by V2. V3 is not used.

Upon selection of a middle page by PS, the shift amount of Vrb is designated by V1, the shift amount of Vrd is designated by V2, and the shift amount of Vrf is designated by V3.

Upon selection of an upper page by PS, the shift amount of Vrc is designated by V1, and the shift amount of Vrg is designated by V2. V3 is not used.

In the negative sensing mode, the CPU 203 sets, to V1 to V3, voltages obtained by adding the bias Vbias to the determination voltages corrected by the operation of S205.

The number of determination voltages to set by this command sequence may be changed depending on the data capacity of one memory cell. For example, when one memory cell stores four-value data, one or two determination voltages are set.

When receiving the sequence from EFh to V3, the access circuit 130 places the ready/busy signal RBn in a busy state and then back in a ready state. The controller 200 then transmits a command sequence from PS to 30h corresponding to a read command to the NAND flash memory chip 100.

In the read command, PS is a command for selecting a page, as with the PS that is transmitted to set the determination voltages. A combination of OOh and 30h indicates an instruction to read data from a page. CA1 and CA2 constitute a column address, and RA1, RA2, and RA3 constitute a row address.

When receiving the read command, the access circuit 130 reads data from a page of the memory cell array 111 designated by RA1, RA2, and RA3. The access circuit 130 places the ready/busy signal RBn in the busy state while reading the data from the memory cell array 111 (tR).

When the ready/busy signal RBn turns from the busy state to the ready state, the controller 200 transmits a command sequence from 05h to E0h corresponding to a data output command to the NAND flash memory chip 100.

In the data output command, a combination of 05h and E0h indicates an instruction to output a range of data designated by a column address from read data in one page of the memory cell array 111. CA1 and CA2 constitute a column address and indicate the range of data to output. RA1, RA2, and RA3 constitute a row address, and designate the same row address as the read command.

When receiving the data output command, the access circuit 130 places the ready/busy signal RBn in the busy state once, and then outputs the data.

Returning to FIG. 12, with no negative determination voltage found (NO in S206), the CPU 203 sets the normal mode (S209). The CPU 203 then commands the NAND flash memory chip 100 to execute a read operation with a designated determination voltage (S210). In the preset normal mode, the CPU 203 does not need to explicitly set the normal mode at data read timing. In this case, the CPU 203 transmits the command sequence illustrated in FIG. 15 upon every completion of the read operation (S208) in the negative sensing mode.

Figures 15, 16:
FIG. 15 is a diagram illustrating an example of a command sequence for setting a normal mode in the first embodiment.
FIG. 16 is a diagram illustrating an example of the configuration of learning information in a second embodiment.

In S207, the controller 200 transmits, for example, such a command as illustrated in FIG. 15 to the NAND flash memory chip 100. The controller 200 instructs the NAND flash memory chip 100 by a combination of EFh, $\alpha\alpha$h, and OFF to operate in the normal mode. OFF is a command for setting VSRC (Vbias) to zero.

In S210, the controller 200 transmits, for example, such a command as illustrated in FIG. 14 to the NAND flash memory chip 100. However, in S210 various determination voltages corrected by the operation of S205 are set to V1 to V3.

Read data including data held in each memory cell is transmitted to the controller 200 by the operation of S208 or S210.

The ECC circuit 206 detects and corrects an error bit in the read data (S211). The CPU 203 determines whether or not error correction has succeeded (S212). For example, the ECC circuit 206 notifies the CPU 203 of a success or failure of the error correction. The CPU 203 determines a success or failure of the error correction from the notification from the ECC circuit 206.

Upon a successful error correction (Yes in S212), the read operation is completed.

Upon determining a failure of the error correction (NO in S212), the CPU 203 determines whether or not to execute a retry read operation (S213).

The retry read operation is an operation for re-executing the read operation using varied determination voltages. In the retry read operation, at least determination voltages different from the determination voltages corrected by the operation of S205 are used. The CPU 203 controls the access circuit 130 to execute the read operation, using the varied determination voltages.

A method for varying the determination voltage is not limited to a specific method. Moreover, a method for determining whether or not to execute the retry read operation is not limited to a specific method.

As an example, a plurality of patterns of all the determination voltages is prepared in advance. The CPU 203 repeats a retry read operation until error correction succeeds. The CPU 203 uses the patterns in order for every retry read operation. In the operation of S213, with an unused pattern remaining, the CPU 203 determines to execute a retry read operation. With no unused pattern remaining, the CPU 203 determines not to execute a retry read operation.

As another example, the CPU 203 executes a distribution read operation to the NAND flash memory chip 100. The distribution read operation is an operation for measuring threshold voltage distributions of the memory cells through monitoring the number of memory cells in ON state or OFF state connected to a selected word line, while shifting an applied voltage to the selected word line by predetermined increments. The CPU 203 decides required optimal determination voltages on the basis of the threshold voltage distributions of the memory cells obtained by the distribution read operation. The CPU 203 then re-executes the read operation using the decided optimal determination voltages. With no execution of the read operation using the optimal determination voltages in the operation of S213, the CPU 203 determines to execute a retry read operation. With the read operation executed using the optimal determination voltages, the CPU 203 determines not to execute a retry read operation.

Upon determining to execute a retry read operation (Yes in S213), the CPU 203 varies part or all of the determination voltages corresponding to the page to read (S214). For example, the CPU 203 sets one of unused patterns as the varied determination voltages. Alternatively, the CPU 203 sets the optimal determination voltages obtained by the distribution read operation as the varied determination voltages. The operation of S206 is executed after the operation of S214.

When determining not to execute a retry read operation (NO in S213), the CPU 203 executes an operation for a failure of error correction (S215), and completes the read operation.

The operation for the error-correction failure is not limited to a specific operation. As an example, the CPU 203 may notify the host apparatus 300 of the occurrence of an uncorrectable error. As another example, the controller 200 may additionally include an error correction function with a higher correction capability than that of the ECC circuit 206, and the CPU 203 may attempt an error correction, using the error correction function with higher correction capability.

As described above, according to the first embodiment, the controller 200 executes the program operation (S101 to S103), and then executes the first read operation (S201 to S215). In the program operation, the controller 200 executes the program operation (S101), measures the temperature during the program operation (S102), and stores the measured temperature (S103). In the first read operation, the controller 200 measures the temperature with the temperature sensor (S201), computes a difference between the temperature during the program operation and the temperature during the first read operation (S202), acquires a determination voltage before correction (S203), corrects the acquired determination voltage according to the difference (S204 and S205), and controls the access circuit 130 to acquire data corresponding to the threshold voltage on the basis of a comparison between the corrected determination voltage and the threshold voltage (S206 to S210).

Owing to such configuration, the determination voltage is corrected in the read operation according to the variation in the threshold voltage caused by the temperature during use, which makes it possible to reduce the number of error bits in read data.

The controller 200 determines whether or not the sign of the corrected determination voltage is negative in the first read operation (S206). When determining that the sign of the corrected determination voltage is negative, the controller 200 controls the access circuit 130 to bias the potential of the source line SL by a predetermined value (S208). When determining that the sign of the corrected determination voltage is not negative, the controller 200 does not control the access circuit 130 to bias the potential of the source line SL (S210).

Owing to such configuration, the access circuit 130 can be controlled to determine data using an apparent negative determination voltage even when the sign of the corrected determination voltage is negative. Hence, when the sign of the optimal determination voltage is negative, a determination voltage close to the optimal determination voltage can be applied. This makes it possible to reduce the number of error bits in read data as compared with that in the normal mode in which a negative voltage value cannot be applied as the determination voltage.

In the above description, use or non-use of the negative sensing mode is decided depending on whether the sign of the corrected determination voltage is negative, that is, whether the corrected determination voltage exceeds or falls below zero. The threshold for determining whether or not to use the negative sensing mode may not be zero. For example, if the settable minimum word line potential VCG_min is not zero, use or non-use of the negative sensing mode may be determined, using VCG_min as the threshold.

The memory system 1 further includes the ECC circuit 206 that detects and corrects error in read data. In case of a failure of error correction by the ECC circuit 206 (NO in S212), the controller 200 executes one or more retry read operations (S213 and S214). Each retry read operation is a retry operation for allowing the access circuit 130 to acquire data while changing the determination voltages for use.

In the first embodiment, in the first read operation, determination voltages for the read operation are corrected according to the variation in the threshold voltage caused by the operating temperature, which can reduce the number of error bits in read data and reduce the number of failures of error correction by the ECC circuit 206. Thereby, the number of retry read operations to execute is reduced, which reduces read latency. Moreover, the decrease in the number of retry read operations to execute leads to reducing read stress on the NAND flash memory. Consequently, the reliability of the memory system 1 is improved.

Second Embodiment

The hardware configuration of a memory system 1 of a second embodiment is the same as that of the first embodiment. Hence, hardware components of the memory system 1 of the second embodiment are denoted by the same reference numerals and names as those of the first embodiment.

In the second embodiment, determination voltages are corrected according to a difference (hereinafter Tr2−Tr1 as an example) between a temperature (denoted as Tr1) in the first read operation and a temperature (denoted as Tr2) in a second read operation. The second read operation is executed after the first read operation.

Specifically, the CPU 203 learns a relationship between determination voltages used in the first read operation and the temperature Tr1, after the first read operation. In the second read operation, the CPU 203 acquires determination voltages corrected in accordance with the difference (Tr2−Tr1) between the temperatures Tr1 and Tr2, on the basis of a learning result and the temperature Tr2 during the second read operation.

The determination voltages used in the first read operation refer to determination voltages used at the time of a successful correction of error in read data.

Herein, as an example, learning refers to correcting the determination voltages used in the first read operation according to a difference (hereinafter Tbase−Tr1 as an example) between the temperature Tr1 and a predetermined reference temperature (denoted as Tbase) and storing corrected voltages (reference voltages). The reference voltages are recorded in learning information 223.

FIG. 16 is a diagram illustrating an example of the configuration of the learning information 223 of the second embodiment. According to the example illustrated in FIG. 16, a reference voltage for each of all the determination voltages (Vra to Vrg) is recorded for each block BLK in the learning information 223. The learning information 223 may store a reference voltage in each unit area. The unit area is a memory area having a predetermined size, and is, for example, a package including one or more NAND flash memory chips 100, a plurality of packages, a NAND flash memory chip 100, a block BLK, a string unit SU, a word line WL, or a group of word lines WL.

The learning method is not limited to the above method. For example, through the learning, a pair of the determination voltages used in the first read operation and the temperature Tr1 may be stored.

As with the temperature information 222, the learning information 223 may be saved in the NAND flash memory chip 100 before power-off and loaded into the RAM 202 upon startup.

Figure 17:
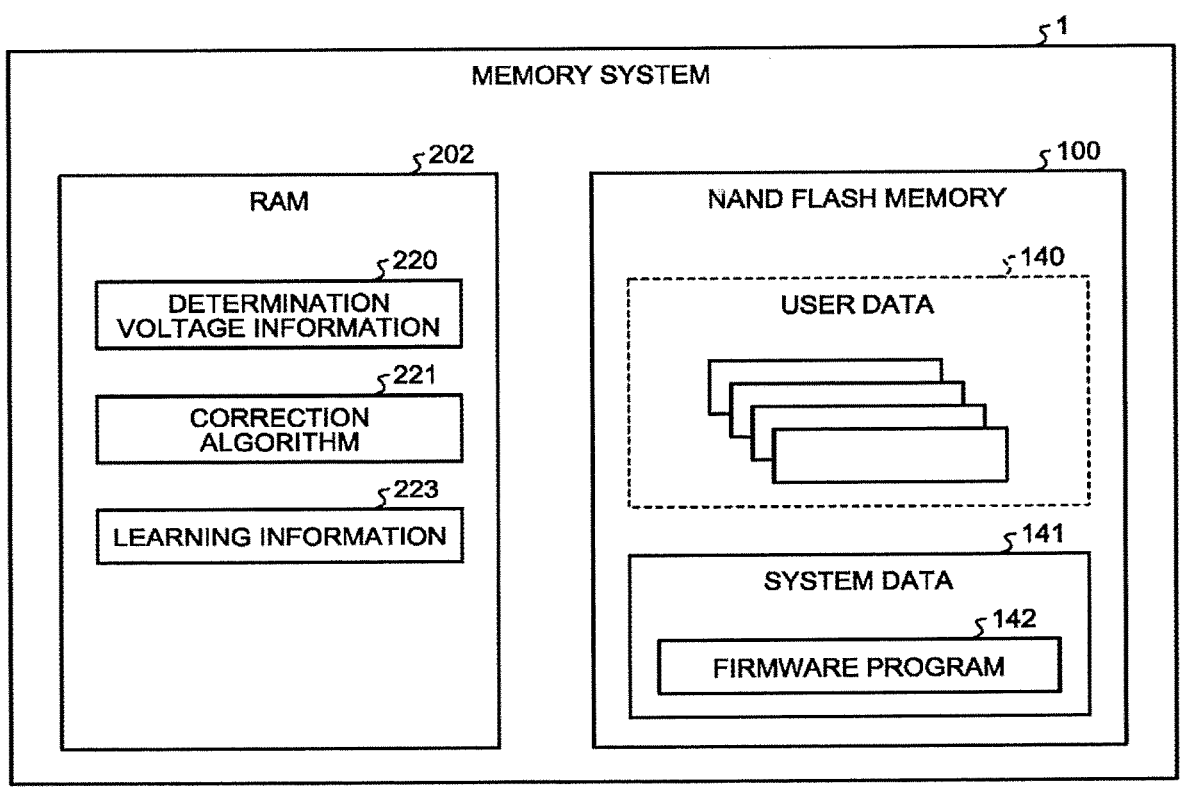
FIG. 17 is a diagram explaining various types of data held in a memory system of the second embodiment.

FIG. 17 is a diagram explaining various types of data held in the memory system 1 of the second embodiment.

The NAND flash memory chip 100 stores the user data 140 and the system data 141 as in the first embodiment.

The RAM 202 stores the determination voltage information 220, the correction algorithm 221, and the above-mentioned learning information 223.

The CPU 203 converts the determination voltages used in the first read operation into the reference voltages by the correction algorithm 221.

Specifically, the CPU 203 computes the difference (Tbase−Tr1) between the reference temperature Tbase and the temperature Tr1. The CPU 203 then acquires a value (a correction value Vcor1) of the variation Vdif in the threshold voltage, the variation occurring when the temperature difference Tdif is (Tbase−Tr1). The CPU 203 then acquires the reference voltages by adding the correction value Vcor1 to the determination voltages used in the first read operation.

The CPU 203 computes determination voltages to use in the second read operation on the basis of the correction algorithm 221 and the temperature Tr2.

Specifically, the CPU 203 computes a difference (Tr2−Tbase) between the temperature Tr2 and the reference temperature Tbase. The CPU 203 then acquires a value (a correction value Vcor2) of the variation Vdif in the threshold voltage, the variation occurring when the temperature difference Tdif is (Tr2−Tbase). The CPU 203 then acquires the determination voltages to use in the second read operation by adding the correction value Vcor2 to the reference voltages.

In other words, the determination voltages used in the first read operation are corrected according to the temperature difference between the temperatures Tr1 and Tbase to obtain the reference voltages. The reference voltages are corrected according to the temperature difference between the temperatures Tbase and Tr2 to obtain the determination voltages to use in the second read operation. Hence, the determination voltages to use in the second read operation are equal to voltages obtained by correcting the determination voltages used in the first read operation according to the temperature difference between the temperatures Tr1 and Tr2.

In the following a series of operations including the first read operation by the memory system 1 will be referred to as the first read operation. A series of operations including the second read operation by the memory system 1 will be referred to as the second read operation. The second read operation is executed to a unit area being a subject of the first read operation, after the first read operation.

Figure 18:
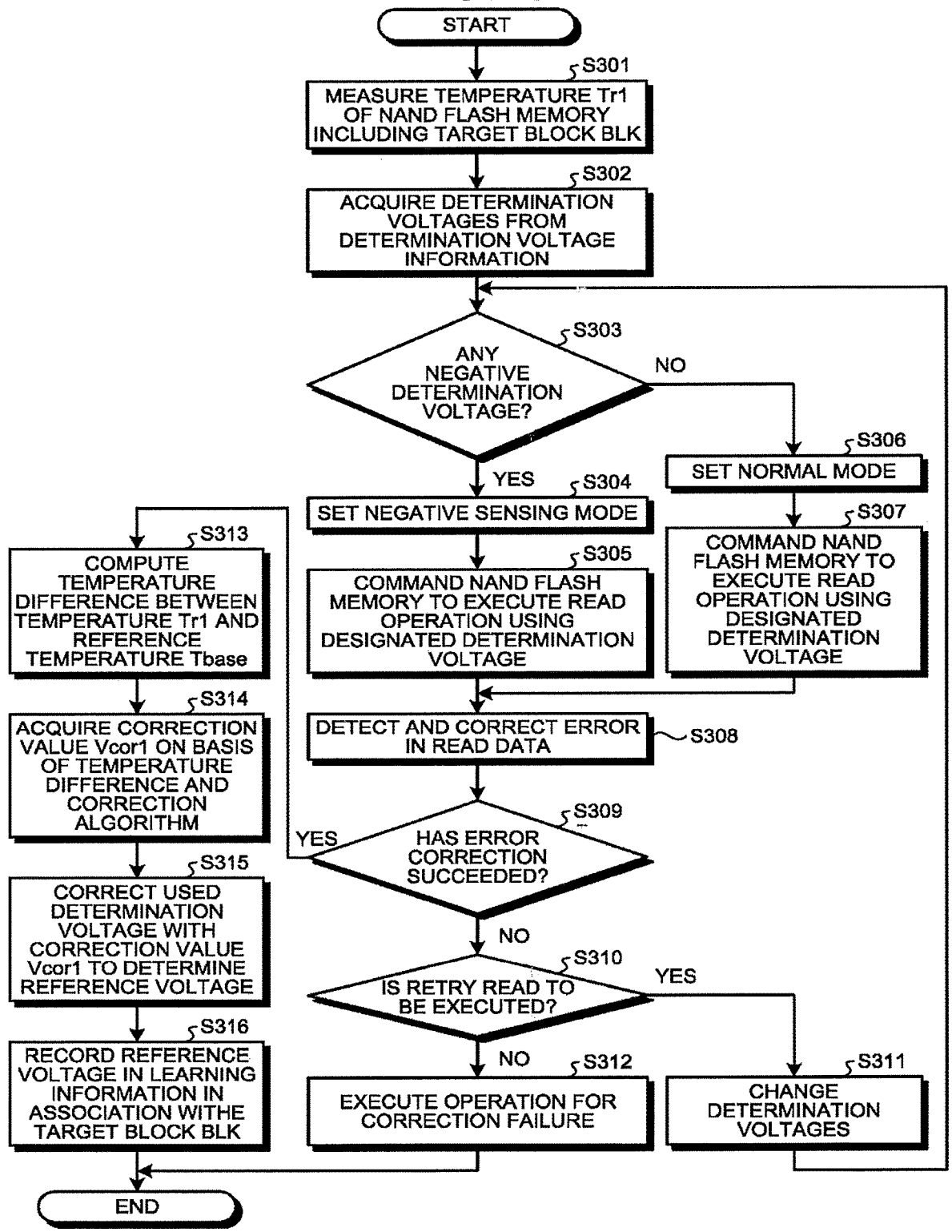
FIG. 18 is a flowchart explaining a first read operation of the memory system of the second embodiment.

FIG. 18 is a flowchart explaining the first read operation of the memory system 1 of the second embodiment. In FIG. 18, a subject of the first read operation is referred to as a target.

Firstly, the CPU 203 measures the temperature Tr1 of the NAND flash memory chip 100 including a target block BLK (S301). The CPU 203 then acquires determination voltages from the determination voltage information 220 (S302). The CPU 203 acquires different determination voltages according to the types of page to read.

Through operations of S303 to S308, the CPU 203 executes data read in the negative sensing mode or the normal mode, and detects and corrects error in the read data, as shown in the operations in S207 to S211.

The CPU 203 then determines whether or not error correction has succeeded (S309). Upon determining a failure of the error correction (NO in S309), the CPU 203 executes operations in S310 to S312, as shown in S213 to S215. After the operation of S311, the operation of S303 is executed.

Upon determining a success of the error correction (Yes in S309), the CPU 203 computes the difference (Tbase−Tr1) between the temperature Tr1 and the reference temperature Tbase (S313). The CPU 203 then acquires the correction value Vcor1 on the basis of the difference (Tbase−Tr1) and the correction algorithm 221 (S314). The CPU 203 then corrects the determination voltage used at the time of acquiring the error-corrected data, using the correction value Vcor1, to decide a reference voltage (S315). The CPU 203 records the reference voltage in the learning information 223 in association with the target block BLK (S316). The first read operation completes in S316.

The CPU 203 executes the operations of S314 to S316 to each of the determination voltages corresponding to the page to read.

Figure 19:
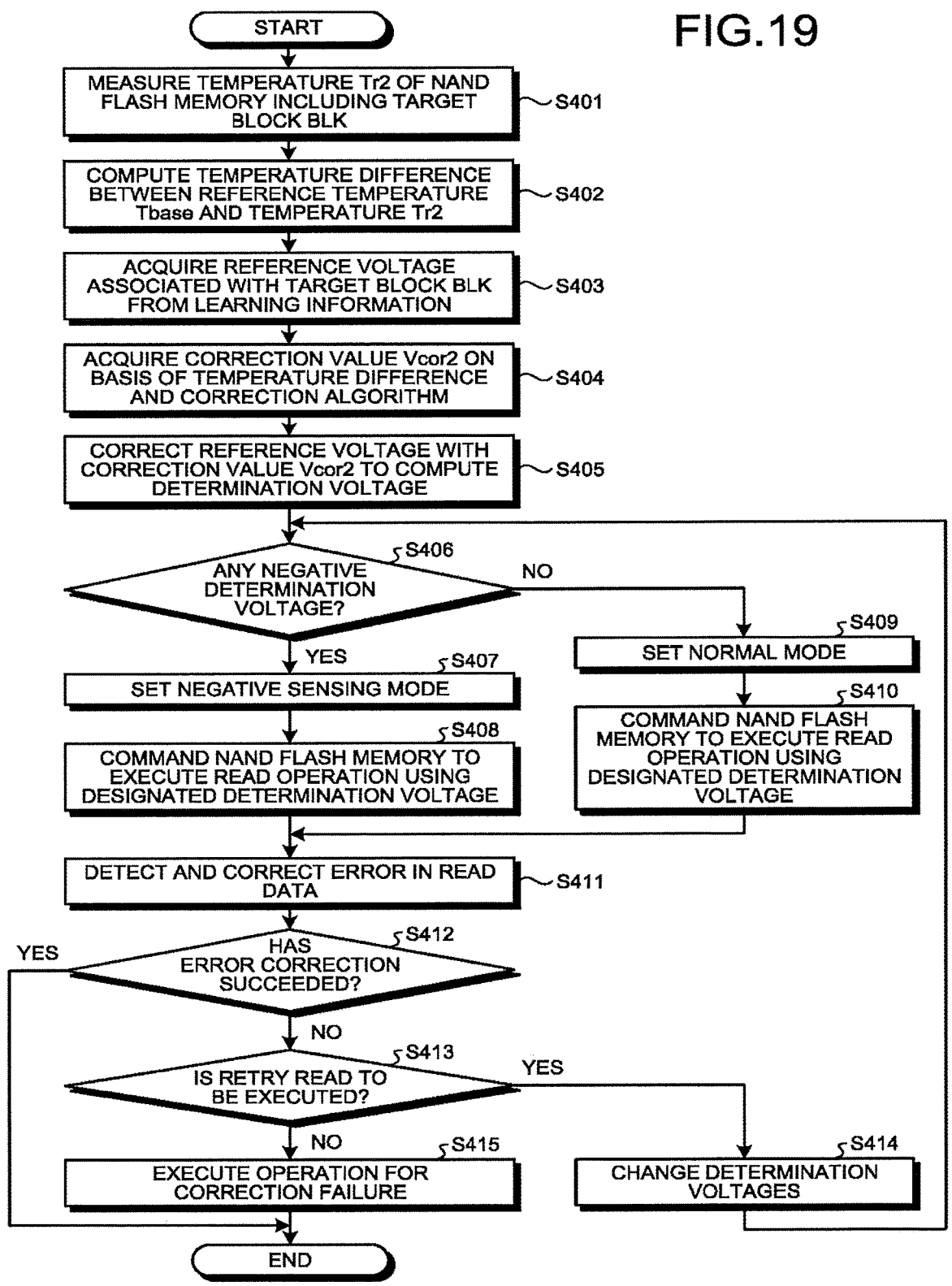
FIG. 19 is a flowchart explaining a second read operation of the memory system of the second embodiment.

FIG. 19 is a flowchart explaining the second read operation of the memory system 1 of the second embodiment. In FIG. 19, a subject of the second read operation is referred to as a target. The target of the second read operation corresponds to a unit area where the first read operation has been executed (herein, the block BLK).

Firstly, the CPU 203 measures the temperature Tr2 of the NAND flash memory chip 100 including the target block BLK (S401). The CPU 203 then computes the difference (Tr2−Tbase) between the reference temperature Tbase and the temperature Tr2 (S402).

The CPU 203 then acquires a reference voltage associated with the target block BLK from the learning information 223 (S403). The CPU 203 then acquires the correction value Vcor2 on the basis of the difference (Tr2−Tbase) and the correction algorithm 221 (S404). The CPU 203 then computes a determination voltage by correcting the reference voltage, using the correction value Vcor2 (S405).

The CPU 203 executes the operations of S403 to S405 to each of the determination voltages corresponding to the page to read.

In S406 to S415, the same operations as S206 to S215 are subsequently executed.

In this manner, in the second embodiment, the controller 200 executes the first read operation (S301 to S316), and subsequently executes the second read operation (S401 to S415). In the first read operation, the controller 200 measures the temperature with the temperature sensor 210 (S301), acquires determination voltages (S302 and S311), and controls the access circuit 130 to acquire data corresponding to the threshold voltage on the basis of a comparison between the threshold voltage and the determination voltages (S303 to S309). In the first read operation, the controller 200 learns a relationship between the determination voltages used to acquire the data and the measured temperature (S313 to S316). In the second read operation, the controller 200 measures the temperature with the temperature sensor 210 (S401), acquires a determination voltage corrected according to a difference between the measured temperature and the reference temperature on the basis of the result of learning in the first read operation and the temperature measured in the second read operation (S402 to S405), and controls the access circuit 130 to acquire data using the acquired determination voltage (S406 to S410).

By such configuration, the determination voltages in the read operation are corrected according to the variation in the threshold voltage caused by temperature, which can reduce the number of error bits in read data as compared with no correction to the determination voltages in the read operation according to the variation in the threshold voltage caused by temperature.

Moreover, in the second read operation, the controller 200 determines whether or not the sign of the acquired determination voltage is negative (S406). Upon determining that the sign of the corrected determination voltage is negative, the controller 200 controls the access circuit 130 to bias the potential of the source line SL by a predetermined value (S408). Upon determining that the sign of the corrected determination voltage is not negative, the controller 200 does not control the access circuit 130 to bias the potential of the source line SL (S410).

By such configuration, as in the first embodiment, it is made possible to reduce the number of error bits in read data when the sign of the corrected determination voltage is negative as compared with no bias to the potential of the source line SL by the access circuit 130.

In the second embodiment, the threshold for determining whether or not to use the negative sensing mode is set to zero in the first and second read operations. As with the first embodiment, the threshold for determining whether or not to use the negative sensing mode may be set to a value other than zero.

In the case of a failure of error correction to read data in the first read operation (NO in S309), the controller 200 executes one or more retry read operations (S310 and S311). The controller 200 executes learning, using the determination voltages used at the time of the successful error correction (Yes in S309 and S313 to S316).

In this manner, the controller 200 learns the relationship between the determination voltages and the temperature upon success of error correction, and uses the learning result in the second read operation as a reference for the correction according to the temperature. As described above, these correction values and corrected determination voltages depend on the use history of the NAND flash memory 100. Using learning information in the second read operation, the read voltage is corrected in accordance with the use history of the NAND flash memory. Hence, this can greatly reduce the number of error bits in read data in the second read operation.

In the first read operation, the controller 200 computes the difference between the temperature during the first read operation and a predetermined reference temperature (S313), corrects the determination voltages used at the time of the successful error correction according to the difference (S314 and S315), and records the obtained voltages (reference voltages) as the learning result in the learning information 223.

The controller 200 may record, in the learning information 223, a pair of the determination voltages (used at the time of successful error correction) and the temperature (the measured value of the temperature during the first read operation). However, to record pairs of the determination voltages and the temperatures in the learning information 223, the learning information 223 needs to have a larger size than to record the reference voltages alone. Thus, the controller 200 records the reference voltages as the learning result in the learning information 223, thereby enabling a reduction in the size of the learning information 223.

To record pairs of the determination voltages and the temperatures in the learning information 223, the controller 200 needs to be configured to correct, in the second read operation, the determination voltages recorded in the learning information 223, on the basis of the difference between the temperature recorded in the learning information 223 and the temperature during the second read operation.

In the above description, the flow of the first read operation (FIG. 18) and the flow of the second read operation (FIG. 19) are separately described. The first and second read operations can be implemented as one flow. For example, upon start of the read operation, the controller 200 checks whether there is a learning value for a target block BLK. With no recorded learning value found, the controller 200 executes the first read operation and, with a recorded learning value found, executes the second read operation.

Third Embodiment

The first and second embodiments may be combined.

For example, after succeeding in the error correction to read data (Yes in S212), the memory system 1 executes the operations of S313 to S316. Consequently, in the read operation subsequent to the program operation, the memory system 1 corrects the determination voltages in accordance with the difference between the temperatures in the program operation and in the read operation, and learn the relationship between the determination voltages used in the read operation and the temperature during the read operation. In the subsequent read operation, the memory system 1 executes the second read operation of the second embodiment.

By such configuration, the third embodiment can attain the effects of the first and second embodiments.

Moreover, in the second embodiment, after succeeding in the error correction to read data in the second read operation (Yes in S412), the memory system 1 may execute the operations of S313 to S316. Hence, the memory system 1 updates the learning result upon every execution of the second read operation, thereby attaining the effect of the second embodiment in each of repeated read operations.

Moreover, the read operation of the first embodiment, the first read operation of the second embodiment, and the second read operation of the second embodiment may be executed in response to a read request from the host apparatus 300, or may be executed in a patrol read.

The patrol read refers to a background read operation to be executed for checking the integrity of data held in a memory cell. The patrol read is regularly executed to, for example, all the blocks BLK or sampled block or blocks among the blocks BLK. In the patrol read, the controller 200 actually performs a read operation, and detects and corrects error in read data. The controller 200 then determines the integrity of the data from a result of the error detection and correction. If the ECC circuit 206 fails to correct error, for example, the controller 200 sets the read block BLK as a subject of refresh operation. The refresh operation refers to an operation for reducing errors contained in data held in the memory cells by programming the data to the memory cells again. Specifically, the refresh operation includes reading data from a block BLK with retry read operations if necessary, correcting the data by the ECC circuit 206 (and another ECC circuit with higher correction capability), and program the corrected data to another block BLK. Alternatively, the source block BLK and the destination block BLK of the refresh operation may be a same block.

The controller 200 may execute the read operation of the first embodiment, the first read operation of the second embodiment, or the second read operation of the second embodiment to a selected target block BLK for the patrol read. Moreover, the controller 200 may execute any of the read operation of the first embodiment, the first read operation of the second embodiment, and the second read operation of the second embodiment, in any read operation, in addition to the read operation in response to a read request from the host apparatus 300 and the read operation in the patrol read.

In the first and second embodiments, the temperature sensor 210 is provided outside the NAND flash memory 100. As described above, the temperature sensor 210 may be built in the NAND flash memory chip 100. In this case, the CPU 203 needs to transmit a command for acquiring temperature data to the NAND flash memory 100 in, for example, S102, S201, S301, and S401.

Figure 20:
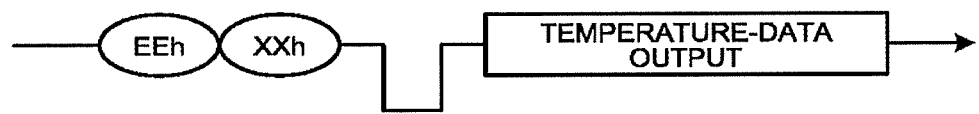
FIG. 20 is a diagram illustrating an example of a command sequence for requesting temperature data in a third embodiment.

FIG. 20 shows an exemplary command sequence for acquiring temperature data. In FIG. 20, a combination of EEh and XXh constitutes a request command for the output of temperature data.

When receiving the request command for the output of temperature data, the access circuit 130 places the ready/busy signal RBn in the busy state, and acquires a temperature detection value from the corresponding temperature sensor 210. Upon completion of the acquisition of the temperature detection value, the access circuit 130 places the ready/busy signal RBn in the ready state, and sets the acquired temperature detection value as the temperature data.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory system comprising:
   a first nonvolatile memory including a memory cell transistor and an access circuit configured to control a threshold voltage of the memory cell transistor;
   a temperature sensor; and
   a controller configured to execute, to the first memory, a program operation first and a first read operation next, wherein
   the program operation is an operation including (i) acquiring a first temperature with the temperature sensor, (ii) storing the first temperature, and (iii) controlling the access circuit to set the threshold voltage of the memory cell transistor at a value corresponding to first data, and
   the first read operation is an operation for (i) acquiring a second temperature with the temperature sensor, (ii) computing a difference between the second temperature and the first temperature, (iii) acquiring a first determination voltage, (iv) correcting the first determination voltage according to the difference, and (v) controlling the access circuit to acquire second data corresponding to the threshold voltage on the basis of a comparison between the threshold voltage of the memory cell transistor and a second determination voltage, the second determination voltage being the corrected first determination voltage.

2. The memory system according to claim 1, wherein, in the first read operation,
   the controller compares the second determination voltage and a first value, and
   when the second determination voltage is lower than the first value, the controller controls the access circuit to bias a potential of a source line of the memory cell transistor by a second value, and
   when the second determination voltage is higher than the first value, the controller does not control the access circuit to bias the potential of the source line.

3. The memory system according to claim 1, further comprising an error correction code circuit configured to detect and correct error in the second data, wherein
   the controller is configured to execute a retry read operation when the error correction code circuit fails to correct the error in the second data, and
   the retry read operation is an operation for controlling the access circuit to retry the acquisition of the second data using a third determination voltage different from the second determination voltage.

4. The memory system according to claim 3, further comprising a second memory configured to store learning information, wherein
   when the error correction code circuit succeeds to correct the error in the second data, the controller learns a relationship between a fourth determination voltage and the second temperature, and records a learning result in the learning information, and
   the fourth determination voltage is the second or third determination voltage used when the error correction code circuit succeeds to correct the error in the second data.

5. The memory system according to claim 4, wherein
   the controller is further configured to execute a second read operation after the first read operation, and
   the second read operation is an operation including (i) acquiring a third temperature with the temperature sensor, (ii) deciding a fifth determination voltage on the basis of the third temperature and the learning information, and (iii) controlling the access circuit to acquire third data corresponding to the threshold voltage of the memory cell transistor, using the fifth determination voltage.

6. The memory system according to claim 5, wherein the controller is configured to compute a difference between the second temperature and a fourth temperature, correct the fourth determination voltage according to the difference, and record a sixth determination voltage in the learning information, the sixth determination voltage being the corrected fourth determination voltage.

7. The memory system according to claim 6, wherein, in the second read operation, the controller computes a difference between the third temperature and the fourth temperature, and decides the fifth determination voltage by correcting the sixth determination voltage according to the difference.

8. The memory system according to claim 2, wherein the first value is zero.

9. The memory system according to claim 1, wherein the temperature sensor is included in the first memory.

10. A memory system comprising:
    a first nonvolatile memory including a memory cell transistor and an access circuit configured to control a threshold voltage of the memory cell transistor;
    a temperature sensor; and
    a controller configured to execute, to the first memory, a first read operation first and a second read operation next, wherein
    the first read operation is an operation including (i) acquiring a first temperature with the temperature sensor, (ii) determining a first determination voltage, (iii) controlling the access circuit to acquire first data corresponding to the threshold voltage of the memory cell transistor on the basis of a comparison between the threshold voltage of the memory cell transistor and the first determination voltage, and (iv) learning a relationship between the first determination voltage and the first temperature, and
    the second read operation is an operation including (i) acquiring a second temperature with the temperature sensor, (ii) determining a second determination voltage being the first determination voltage corrected according to a difference between the second temperature and the first temperature, on the basis of a learning result in the first read operation and the second temperature, and (iii) controlling the access circuit to acquire second data corresponding to the threshold voltage on the basis of a comparison between the threshold voltage and the second determination voltage.

11. The memory system according to claim 10, wherein, in the second read operation,
    the controller compares the second determination voltage and a first value, and
    when the second determination voltage is lower than the first value, the controller controls the access circuit to bias a potential of a source line of the memory cell transistor by a second value, and
    when the second determination voltage is higher than the first value, the controller does not control the access circuit to bias the potential of the source line.

12. The memory system according to claim 10, further comprising an error correction code circuit configured to detect and correct error in the first data, wherein, in the first read operation, the controller controls the access circuit to acquire the first data using a third determination voltage, and to execute a retry read operation when the error correction code circuit fails to correct the error in the first data, the retry read operation is an operation for controlling the access circuit to retry the acquisition of the first data using a fourth determination voltage different from the third determination voltage, and the first determination voltage is the third or fourth determination voltage used when the error correction code circuit succeeds to correct the error in the first data.

13. The memory system according to claim 12, further comprising a second memory configured to store leaning information, wherein, in the first read operation, the controller computes a difference between the first temperature and a third temperature, corrects the first determination voltage according to the difference, and records a fifth determination voltage as a learning result in the learning information, the fifth determination voltage being the corrected first determination voltage.

14. The memory system according to claim 13, wherein, in the second read operation, the controller computes a difference between the second temperature and the third temperature, and acquires the second determination voltage by correcting the fifth determination voltage according to the difference.

15. The memory system according to claim 11, wherein the first value is zero.

16. The memory system according to claim 10, wherein the temperature sensor is included in the first memory.

* * * * *